United States Patent
Yun et al.

(10) Patent No.: US 11,296,066 B2
(45) Date of Patent: Apr. 5, 2022

(54) NON-VOLATILE MEMORY

(71) Applicant: SAMSUNG ELECTRONICS CO., LTD., Suwon-si (KR)

(72) Inventors: Kyung-Hwa Yun, Hwaseong-si (KR); Pan-Suk Kwak, Seoul (KR); Chan-Ho Kim, Seoul (KR); Bong-Soon Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 110 days.

(21) Appl. No.: 16/937,815

(22) Filed: Jul. 24, 2020

(65) Prior Publication Data

US 2020/0365574 A1 Nov. 19, 2020

Related U.S. Application Data

(63) Continuation-in-part of application No. 16/449,286, filed on Jun. 21, 2019, now Pat. No. 11,075,216.

(30) Foreign Application Priority Data

Aug. 21, 2018 (KR) .................. 10-2018-0097561

(51) Int. Cl.
*G11C 16/04* (2006.01)
*H01L 25/18* (2006.01)
(Continued)

(52) U.S. Cl.
CPC .......... *H01L 25/18* (2013.01); *G11C 13/0004* (2013.01); *G11C 13/0026* (2013.01); *G11C 13/0028* (2013.01); *G11C 16/0483* (2013.01); *G11C 16/08* (2013.01); *G11C 16/24* (2013.01); *H01L 24/05* (2013.01); *H01L 24/08* (2013.01); *H01L 25/0657* (2013.01); *H01L 2224/05147* (2013.01); *H01L 2224/08145* (2013.01); *H01L 2924/1431* (2013.01); *H01L 2924/1444* (2013.01); *H01L 2924/14511* (2013.01)

(58) Field of Classification Search
CPC ............ G11C 13/0004; G11C 13/0026; G11C 13/0028; H01L 25/18
USPC .................................................... 365/185.17
See application file for complete search history.

(56) References Cited

U.S. PATENT DOCUMENTS 6,567,287 B2   5/2003   Scheuerlein
8,896,046 B2   11/2014   Kato
(Continued)

*Primary Examiner* — Vu A Le
(74) *Attorney, Agent, or Firm* — Volentine, Whitt & Francos, PLLC

(57) ABSTRACT

A non-volatile memory includes a first semiconductor layer vertically stacked on a second semiconductor layer and including a first memory group, a second memory group, a third memory group and a fourth memory group. The second semiconductor layer includes a first region, a second region, a third region and a fourth region respectively underlying the first memory group, second memory group, third memory group and fourth memory group. The first region includes one driving circuit connected to memory cells of one of the second memory group, third memory group and fourth memory group through a first word line, and another driving circuit connected to memory cells of the first memory group through a first bit line, wherein the first word line and first bit line extend in the same horizontal direction.

20 Claims, 30 Drawing Sheets

(51) Int. Cl.
  *G11C 16/08*   (2006.01)
  *G11C 16/24*   (2006.01)
  *G11C 13/00*   (2006.01)
  *H01L 25/065*  (2006.01)
  *H01L 23/00*   (2006.01)

(56) References Cited

U.S. PATENT DOCUMENTS

| | | |
|---|---|---|
| 9,318,374 B2 | 4/2016 | Atsumi et al. |
| 9,337,198 B2 | 5/2016 | Kwon et al. |
| 9,761,602 B2 | 9/2017 | Oh et al. |
| 9,865,541 B2 | 1/2018 | Kim et al. |
| 2013/0155790 A1 | 6/2013 | Atsumi |
| 2013/0229846 A1* | 9/2013 | Chien .................. G11C 5/02 365/51 |
| 2015/0138862 A1* | 5/2015 | Park .................. G11C 16/0466 365/51 |
| 2017/0373084 A1 | 12/2017 | Shim et al. |

\* cited by examiner

: MC

NON-VOLATILE MEMORY

CROSS-REFERENCE TO RELATED APPLICATION

This application is a continuation-in-part of U.S. application Ser. No. 16/449,286, filed on Jun. 21, 2019, which claims the benefit of Korean Patent Application No. 10-2018-0097561 filed on Aug. 21, 2018 in the Korean Intellectual Property Office, the subject matter of each of which is hereby incorporated by reference.

BACKGROUND

The inventive concept relates to memory devices, and more particularly, to memory devices having a Cell-Over-Periphery (COP) structure.

Contemporary electronic devices are subject to many competing demands Physical size, data storage capacity, data processing speed and user friendliness are ready examples of these demands Contemporary memory devices must support a multiplicity of functions and provide high data storage capacity—while remaining appropriately sized for incorporation within electronic devices. In particular, the area occupied by the overall footprint of memory devices has become an important design consideration. Demands for a reduced footprint has driven memory cell integration, which in turn drive complexity in that layout and wiring of constituent memory device components. Therefore, memory devices including non-volatile memory devices are sought which offer high integration density with relatively uncomplicated layouts and wiring designs.

SUMMARY

The inventive concept provides a cell over periphery (COP) structured non-volatile memory device capable of reducing the size of a peripheral circuit region and/or providing relatively uncomplicated wiring requirements.

According to an aspect of the inventive concept, there is provided a non-volatile memory, including; a first semiconductor layer vertically stacked on a second semiconductor layer and including a first memory group, a second memory group, a third memory group and a fourth memory group, wherein the second semiconductor layer includes a first region, a second region, a third region and a fourth region respectively underlying the first memory group, second memory group, third memory group and fourth memory group, and the first region includes one driving circuit connected to memory cells of one of the second memory group, third memory group and fourth memory group through a first word line, and another driving circuit connected to memory cells of the first memory group through a first bit line, wherein the first word line and first bit line extend in the same horizontal direction.

According to another aspect of the inventive concept, there is provided a non-volatile memory, including; a first semiconductor layer vertically stacked on a second semiconductor layer and including first memory group, second memory group, third memory group and fourth memory group, wherein the second semiconductor layer includes first region, second region, third region and fourth region respectively underlying the first memory group, second memory group, third memory group and fourth memory group, and the first region includes one driving circuit connected to the first memory group, and another driving circuit connected to both the first memory group and one of the second memory group, third memory group and fourth memory group, wherein each of the first memory group and the third memory group includes word lines extending in a first horizontal direction and bit lines extending in a second horizontal direction, and each of the second memory group and the fourth memory group includes word lines extending in the second horizontal direction and bit lines extending in the first horizontal direction.

According to another aspect of the inventive concept, there is provided a non-volatile memory, including; a first semiconductor layer vertically stacked on a second semiconductor layer and including a first memory group and a second memory group, wherein the second semiconductor layer includes a first region underlying the first memory group, a second region underlying the second memory group, and a peripheral region, first memory group includes word lines extending in a first horizontal direction and bit lines extending in a second horizontal direction, and the second memory group includes word lines extending in the second horizontal direction and bit lines extending in the first horizontal direction, the first region includes a first driving circuit connected to the first memory group, the second region includes a second driving circuit connected to the second memory group and a third driving circuit connected to the first memory group, and the peripheral region includes a fourth driving circuit connected to the second memory group.

According to another aspect of the inventive concept, there is provided a non-volatile memory including; a two-by-two horizontal arrangement of tiles in a first semiconductor layer comprising a first tile including a first memory group, a second tile including a second memory group, a third tile including a third memory group and a fourth tile including a fourth memory group, and a two-by-two arrangement of regions in a second semiconductor layer comprising a first region underlying the first tile, a second region underlying the second tile, a third region underlying the third tile and a fourth region underlying the fourth tile, wherein the first region includes a first row decoder having a length in a first horizontal direction equal to a length of the fourth tile and a first page buffer having a length equal to a length of the first tile, the second region includes a second row decoder having a width in a second horizontal direction equal to a width of the first tile and a second page buffer having a width equal to a width of the second tile, the third region includes a third row decoder having a length equal to a length of the second tile and a third page buffer having a length equal to a length of the third tile, and the fourth region includes a fourth row decoder having a width equal to a width of the third tile and a fourth page buffer having a width equal to a width of the fourth tile.

According to another aspect of the inventive concept, there is provided a non-volatile memory including; a two-by-two horizontal arrangement of tiles in a first semiconductor layer comprising a first tile including a first memory group, a second tile including a second memory group, a third tile including a third memory group and a fourth tile including a fourth memory group, and a two-by-two arrangement of regions in a second semiconductor layer comprising a first region underlying the first tile, a second region underlying the second tile, a third region underlying the third tile and a fourth region underlying the fourth tile, wherein the first region includes a first row decoder having a width in a second horizontal direction equal to a width of the first tile and a first page buffer having a width equal to a width of the second tile, the second region includes a second row decoder having a length in a first horizontal direction equal to a length of the second tile and a second page buffer having a length equal to a length of the third tile, the third region includes a third row decoder having a width equal to a width of the third tile and a third page buffer having a width equal to a width of the fourth tile, and the fourth region includes a fourth row decoder having a length equal to a length of the fourth tile and a fourth page buffer having a length equal to a length of the first tile.

According to another aspect of the inventive concept, there is provided a non-volatile memory including: a first semiconductor layer including a first memory group, a second memory group, a third memory group and a fourth memory group; and a second semiconductor layer vertically stacked on the first semiconductor layer and including a first region, a second region, a third region and a fourth region respectively over the first memory group, second memory group, third memory group and fourth memory group, wherein the first region includes one driving circuit connected to memory cells of one of the second memory group, third memory group and fourth memory group through a first word line, and another driving circuit connected to memory cells of the first memory group through a first bit line, wherein the first word line and first bit line extend in the same horizontal direction.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept will be described in some additional detail with reference to the accompanying drawings.

Certain embodiments and embodiment features will be described using spatial, relational and/or geometric terms such as "above", "below", "on top of", "under" "vertical", "horizontal", "stacked on", "underlying", "first direction", "second direction", etc. Those skilled in the art will recognize that these and similar terms may be used in accordance with arbitrarily assumed orientations to better describe embodiment features. The use of such spatial, relational and/or geometric terms will usually be made with reference to one or more illustrated examples. It follows that as assumed geometric orientations change, so too may the relative spatial, relational and/or geometric descriptions.

Figure 1:
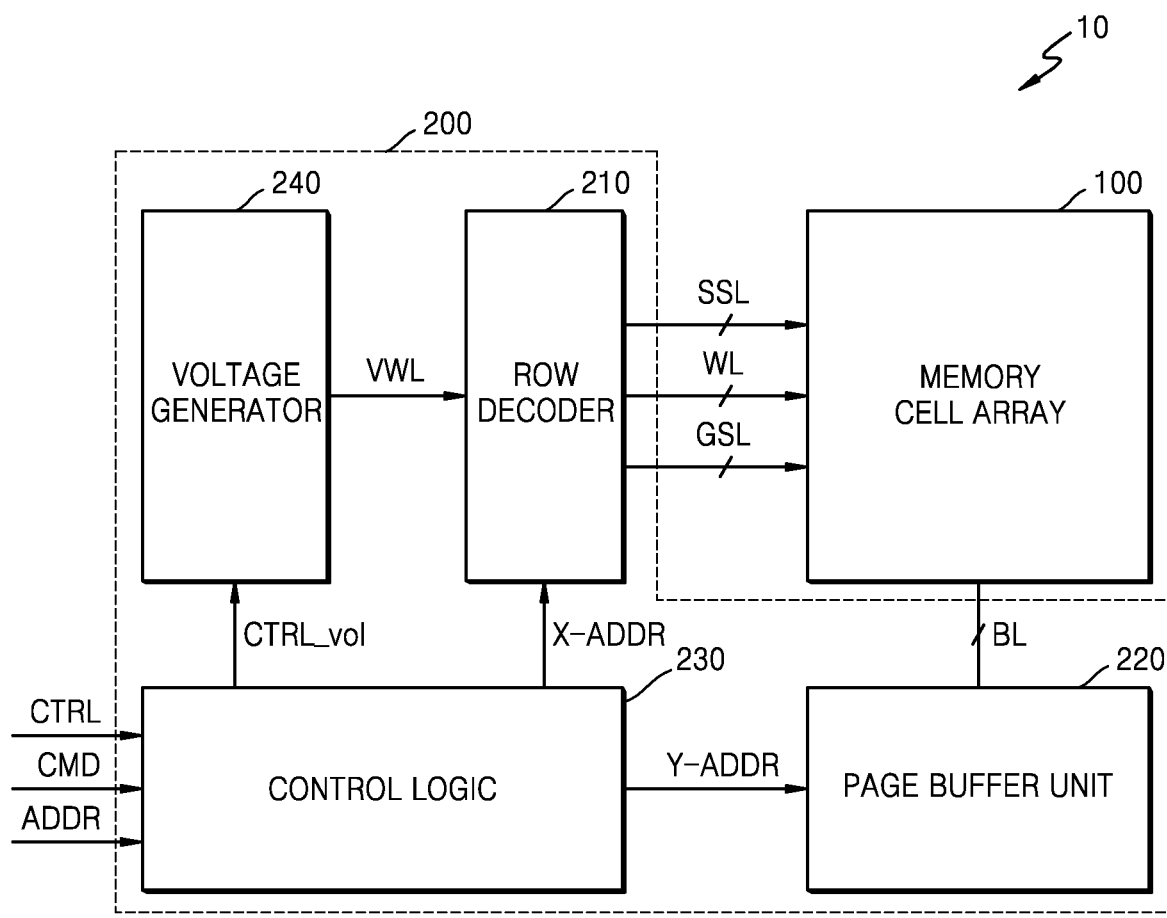
FIG. 1 is a block diagram illustrating a memory device according to an embodiment of the inventive concept.

FIG. 1 is a block diagram illustrating a memory device 10 according to an embodiment of the inventive concept.

Referring to FIG. 1, the memory device 10 generally includes a memory cell array 100 and peripheral circuitry

200. The peripheral circuitry 200 may include, as examples, a row decoder 210, a page buffer unit 220, a control logic 230, and a voltage generator 240. Although not shown in FIG. 1, the peripheral circuitry 200 may further include a data input and output (I/O) circuit, input/output interface(s), column logic, pre-decoder(s), temperature sensor(s), command decoder(s), address decoder(s), moving zone controller(s), scheduler(s), and/or various test and measurement circuit(s).

The memory cell array 100 may be connected to the page buffer unit 220 through one or more bit line(s) BL and may be connected to the row decoder 210 through one or more word line(s) WL, string selecting lines SSL, and/or ground selecting lines GSL. The memory cell array 100 will typically include a vast plurality of memory cells arranged for access through the word lines, bit lines, and/or strings, etc. (e.g., according to various row/column arrangements).

In certain embodiments of the inventive concept, the memory cells may be flash memory cells. Hereinafter, embodiments of the inventive concept will be described under an assumption that the constituent memory cells of a memory cell array are NAND flash memory cells, but this need not be the case in every embodiment of the inventive concept. Instead, as will be appreciated by those skilled in the art, certain embodiments of the inventive concept may include memory cells that are resistive memory cells (e.g., resistive random access memories (RAM) (ReRAM), phase change RAMs (PRAM), and/or magnetic RAMs (MRAM).

In certain embodiments of the inventive concept, the memory cell array 100 may include a three-dimensional memory cell array, such as a three-dimensional memory cell array including a plurality of NAND flash memory cell strings, wherein each of the NAND strings includes memory cells respectively connected to the word lines WL vertically stacked on a principal substrate, as will be described hereafter in some additional detail with reference to FIGS. 3, 4 and 5. Various three-dimensional memory cell arrays are understood by those skilled in the art, such as those described by U.S. Pat. Nos. 7,679,133; 8,553,466; 8,654,587; 8,559,235, and published U.S. Patent Application No. 2011/0233648, the collective subject of which is hereby incorporated by reference.

In other embodiments of the inventive concept, the memory cell array 100 may include, alternately or additionally, a two-dimensional memory cell array.

The control logic 230 of FIG. 1 may be used to provide various control signals controlling (or defining) the nature of various data access operations, such as read operations, program (or write) operations, and erase operations, among other operations. In this regard, the generation and use of various control signals in the operation of the memory device 10 is well understood by those skilled in the art. Exemplary control signals include, voltage control signal CTRL_vol, row address X-ADDR, and column address Y-ADDR which may be generated by the control logic 230 in response to a command CMD, an address ADDR, and/or a control signal CTRL received from an external source (e.g., a memory controller, processor or host device—not shown). One or more externally provided control signals may be applied to the memory device 10, and/or the control logic 230 may be used to control the various operations of the memory device 10.

The voltage generator 240 of FIG. 1 may be used to generate a variety of voltages that are also used to control (or define) the nature of data access operations in response (e.g.) to the voltage control signal CTRL_vol provided by the control logic 230. For example, the voltage generator 240 may be used to generate a variety of word line voltages VWL respectively used during programming, read and erase operations (e.g., read voltage(s), program voltage(s), pass voltage(s), erase voltage(s), program verify voltage(s), erase verify voltage(s), etc.). In addition, the voltage generator 240 may be used to generate string select voltage(s) and/or ground select voltage(s) in response to the voltage control signal CTRL_vol provided by the control logic 230.

In FIG. 1, the row decoder 210 may be used to select memory block(s), word line(s) WL of the selected memory block(s) and non-selected memory block(s), and/or string selecting line(s) SSL in response to the row address X-ADDR provided by control logic 230. The page buffer unit 220 may be used to select bit line(s) BL in response to the column address Y-ADDR. In this regard, the page buffer unit 220 may operate as a program (or write) driver and/or a sense amplifier according to various operating modes of the memory device 10.

Figure 2:
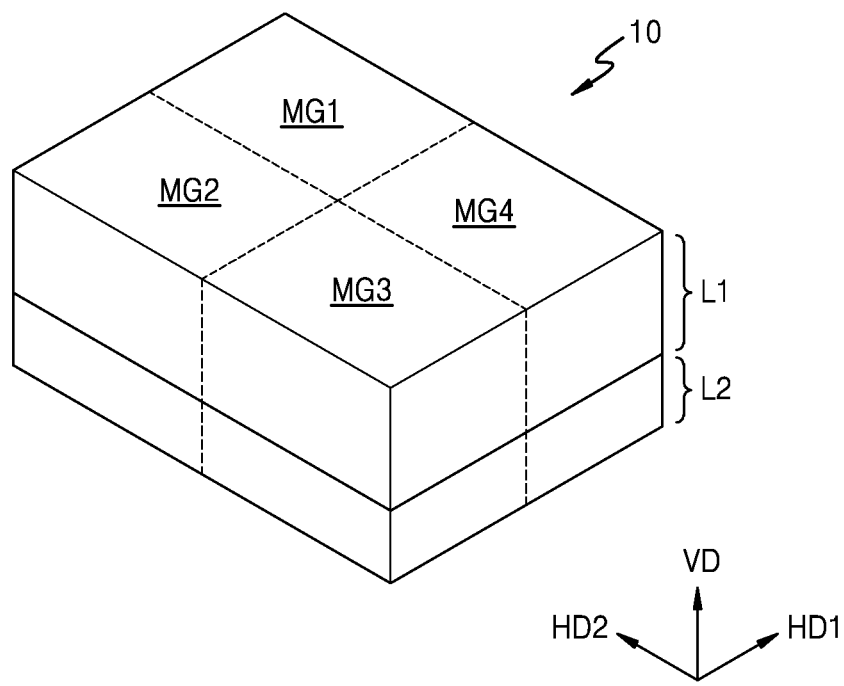
FIG. 2 is a perspective view of a memory device according to an embodiment of the inventive concept.

As conceptually illustrated in FIG. 2, certain embodiments of the inventive concept may include a memory cell array including two or more memory devices (e.g., MG1, MG2, MG3 and MG4). Various material layer(s), feature(s) and/or structure(s) forming the memory cell array 100 may be arranged above (or vertically stacked on) material layer (s), feature(s), and structure(s) forming the peripheral circuitry 200. Hereafter, for the sake of descriptive simplicity, the various material layer(s), feature(s) and/or structure(s) forming the memory cell array 100 will be referred to as "a first semiconductor layer" which is said to be vertically stacked on "a second semiconductor layer" including the various material layer(s), feature(s) and/or structure(s) forming the peripheral circuitry 200. In this regard, it is possible that in certain embodiments of the inventive concept, some relatively smaller peripheral circuits may be disposed in the first semiconductor layer with the memory cell array 100, but principal or relatively larger peripheral circuitry will typically be disposed in the second semiconductor layer. In this regard, the peripheral circuitry 200 may be arranged proximate to a principal substrate, whereas the memory cell array 100 may be arranged more distant from the principal substrate.

In certain embodiments of the inventive concept, the memory cell array 100 may include a number of "memory groups", wherein each memory group includes a plurality of memory cells that may be accessed by the operation of one or more peripheral circuits (e.g., driving circuits) in the peripheral circuitry 200. More particularly in certain embodiments of the inventive concept, respective driving circuits may be arranged in corresponding spatial disposition (s) and/or relationship(s) to one or more memory groups.

It should be noted here that continued development of semiconductor processing technologies allows for an increased number of vertically stacked word lines in three-dimensional memory cell arrays. By vertically stacking memory groups and in particular constituent memory group word lines WL on top of related peripheral circuitry, embodiments of the inventive concept are able reduce the lateral (or horizontal) area occupied by the memory device 10. Thus, to the greatest extent reasonably possible the peripheral circuitry 200 should be disposed to underlie the lateral footprint of the memory groups in the memory cell array 100 in order to minimize the lateral area (e.g., the footprint on a motherboard) occupied by the memory device 10.

Consistent with the foregoing and as further illustrated in the embodiment of FIG. 2, a plurality of memory groups (MG1, MG2, MG3 and MG4) may be arranged in the first semiconductor layer L1 to efficiently utilize available lateral area, whereas various peripheral circuits may be arranged in the second semiconductor layer to efficiently underlie the memory groups. Further, in certain embodiments of the inventive concept, at least one driving circuit operatively connected to a particular memory group (e.g., MG1) may be arranged in the second semiconductor layer L2, such that it underlies a different (e.g., an adjacent) memory group (e.g., MG2, MG3 or MG4). Examples of such arrangements will be described hereafter in some additional detail.

Thus, referring to FIG. 2, the memory device 10 may include the first semiconductor layer L1 and the second semiconductor layer L2, where the first semiconductor layer L1 is stacked on the second semiconductor layer L2 in the vertical direction VD. Given this assumed orientation for the "vertical" direction, the first semiconductor layer L1 and the second semiconductor layer L2 may be understood as extending in respective "horizontal" directions (i.e., in a first horizontal direction HD1 and a second horizontal direction HD2). In certain embodiments the second semiconductor layer L2 may be disposed, entirely or in part, on a principal, horizontally-disposed substrate.

It should be noted here that the first semiconductor layer L1 may be directly disposed on the second semiconductor layer L2, or there may be intervening layers between the first semiconductor layer L1 and the second semiconductor layer L2. For example, in certain embodiments of the inventive concept, the first semiconductor layer L1 may be disposed on intervening secondary substrate(s), wholly or in part.

Recognizing that certain embodiments of the inventive concept may include the memory cell array 100 of FIG. 1 disposed in the first semiconductor layer L1 and the peripheral circuitry 200 of FIG. 1 disposed in the second semiconductor layer L2, such embodiments may be understood as having a "Cell-Over-Peripheral" (COP) structure. Further, while only a single "over-layer" (e.g. the first semiconductor layer L1) including a memory cell array (or a plurality of memory groups) is described in the illustrated embodiments, those skilled in the art will recognize that multiple memory cell layers may be vertically stacked on a semiconductor layer principally including peripheral circuitry (e.g., the second semiconductor layer L2).

In this regard, the second semiconductor layer L2 may include substrate(s) and various circuits among the peripheral circuitry 200 that are formed in the second semiconductor layer L2 by the combination of semiconductor devices such as transistors and wiring patterns. After various circuits and wiring are formed in the second semiconductor layer L2, the first semiconductor layer L1 including the memory cell array 100 may be formed, including electrical devices and corresponding wiring (e.g., word lines WL and bit lines BL).

As shown in FIG. 2, first to fourth memory groups MG1 to MG4 may be arranged in the first semiconductor layer L1, where the first and second memory groups MG1 and MG2 are adjacent in the first horizontal direction HD1, the third and fourth memory groups MG3 and MG4 are adjacent in the first horizontal direction HD1, the first and fourth memory groups MG1 and MG4 are adjacent in the second horizontal direction HD2, and the second and third memory groups MG2 and MG3 are adjacent in the second horizontal direction HD2. This particular configuration may be termed a two-by-two memory group arrangement. Further embodiments assuming this particular configuration will be described with reference to FIGS. 7, 8, 9, 10 and 11, but the scope of the inventive concept is not limited to only this configuration.

For example, only two memory groups may be arranged in the first semiconductor layer L1, as will be described in some additional detail with reference to FIGS. 12 and 13. Alternately, three memory groups may be arranged in the first semiconductor layer L1, as will be described in some additional detail with reference to FIGS. 14 and 15. Furthermore, in some embodiments, a plurality of memory devices 100 may be arranged (e.g., concatenated) in the first semiconductor layer L1 as will be described in some additional detail with reference to FIGS. 16 and 17.

Figure 3:
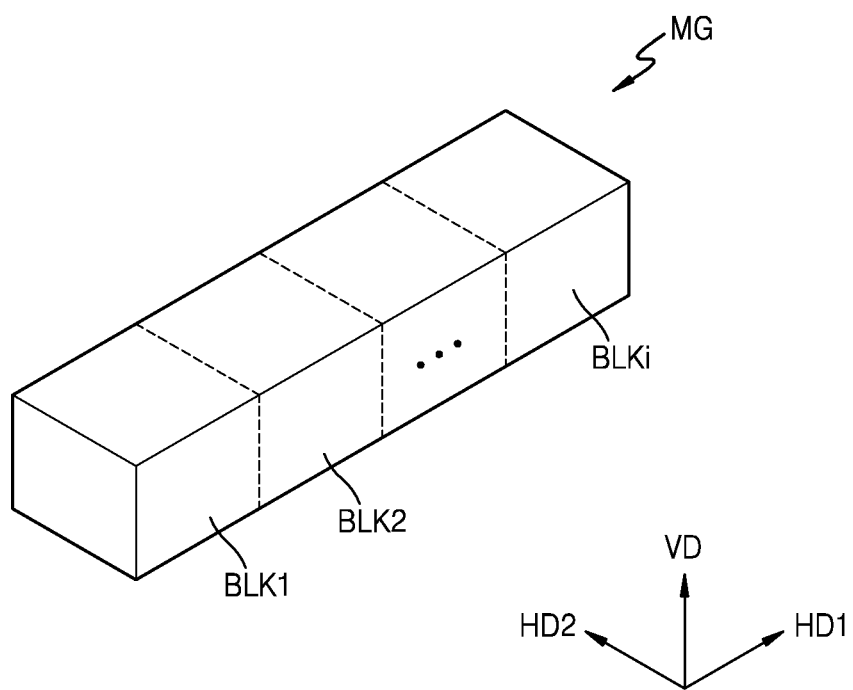
FIG. 3 is a perspective view further illustrating in one example the memory group of FIG. 2.

FIG. 3 is a perspective view illustrating a memory group MG according to an embodiment of the inventive concept. Here, the memory group MG may correspond to one (or each one) of the first to fourth memory groups MG1 to MG4 shown in FIG. 2.

Referring to FIG. 3, the memory group MG may include memory blocks BLK1 to BLKi, where 'i' is a positive integer. Each of the memory blocks BLK1 to BLKi may have a three dimensional (or vertical) structure. That is, each of the memory blocks BLK1 to BLKi may include a plurality of NAND strings extending in the vertical direction VD. The NAND strings may be separated from each other in both the first horizontal and second horizontal directions HD1 and HD2. The memory blocks BLK1 to BLKi may be operatively selected by the row decoder (210 of FIG. 1). For example, the row decoder 210 may select a memory block corresponding to a block address among the memory blocks BLK1 to BLKi.

Figure 4:
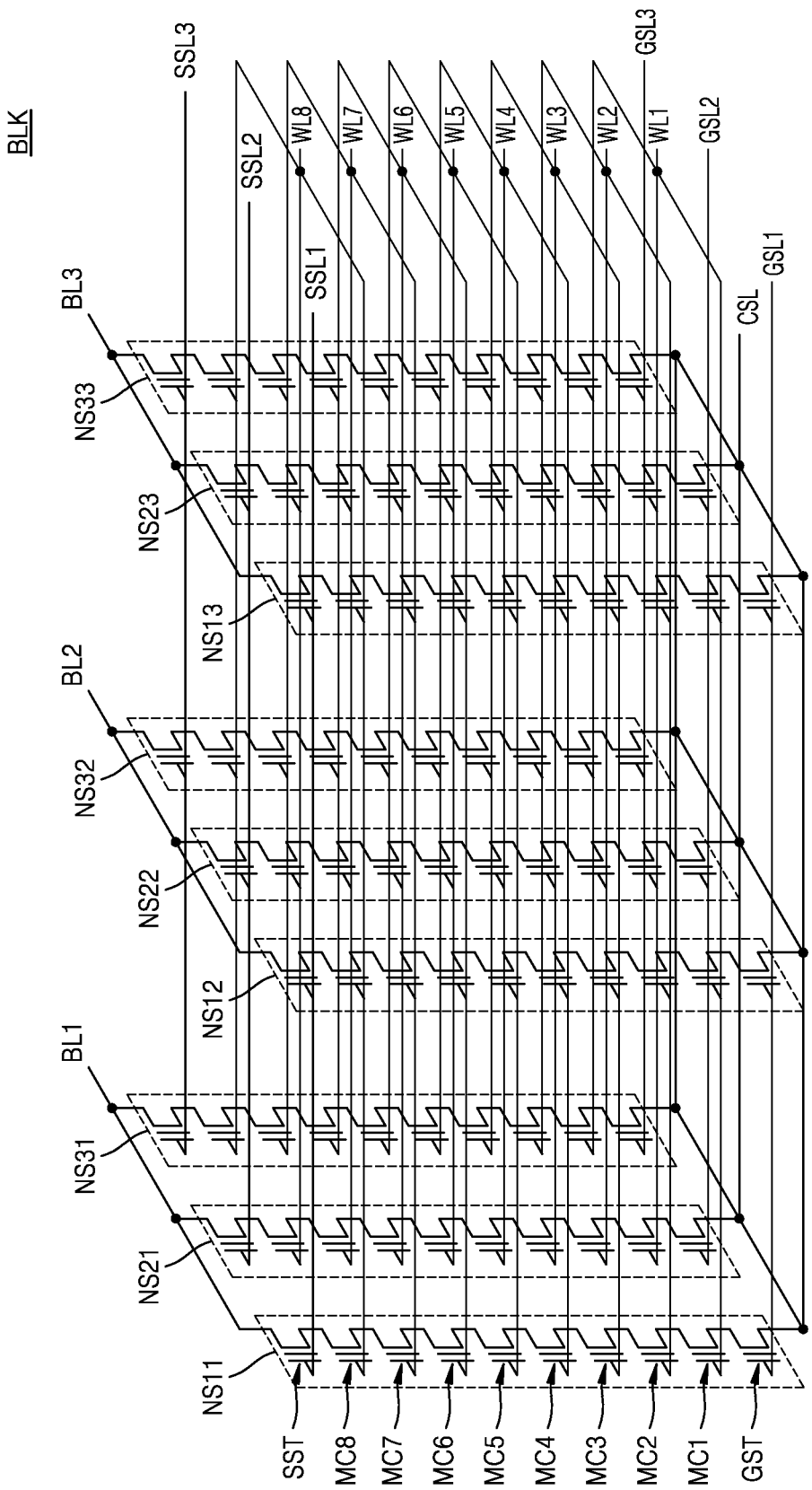
FIG. 4 is an equivalent circuit diagram for the memory block of FIG. 3 according to an embodiment of the inventive concept.

FIG. 4 is an equivalent circuit diagram for the memory block BLK according to an embodiment of the inventive concept. For example, the memory block BLK may correspond to one of the plurality of memory blocks BLK1 to BLKi of FIG. 3.

Referring to FIG. 4, the memory block BLK may include NAND strings NS11 to NS33, word lines WL1 to WL8, bit lines BL1 to BL3, ground selecting lines GSL1 to GSL3, string selecting lines SSL1 to SSL3, and a common source line CSL. Here, the number of NAND strings, word lines, bit lines, ground selecting lines, and string selecting lines may vary according to design choices.

The NAND strings NS11, NS21, and NS31 are provided between the first bit line BL1 and the common source line CSL. The NAND strings NS12, NS22, and NS32 are provided between the second bit line BL2 and the common source line CSL. The NAND strings NS13, NS23, and NS33 are provided between the third bit line BL3 and the common source line CSL. Each NAND string (for example, NS11) may include a string selecting transistor SST, a plurality of memory cells MC1 to MC8, and a ground selecting transistor GST.

The string selecting transistor SST is connected to the corresponding string selecting lines SSL1 to SSL3. The plurality of memory cells MC1 to MC8 are respectively connected to the corresponding word lines WL1 to WL8. The ground selecting transistor GST is connected to the corresponding ground selecting lines GSL1 to GSL3. The string selecting transistor SST is connected to the corresponding bit lines BL1 to BL3 and the ground selecting transistor GST is connected to the common source line CSL.

According to embodiment illustrated in FIG. 4, word lines having a given vertical height are commonly connected across multiple memory cell strings, the string selecting lines SSL1 to SSL3 are separate from each other, and the ground selecting lines GSL1 to GSL3 are separate from each other. In FIG. 4, it is illustrated that the three string selecting lines SSL1 to SSL3 share the word line having the same height. However, the inventive concept is not limited thereto. For example, two string selecting lines may share the word line having the same height. As another example, four string selecting lines may share the word line having the same height.

Figure 5:
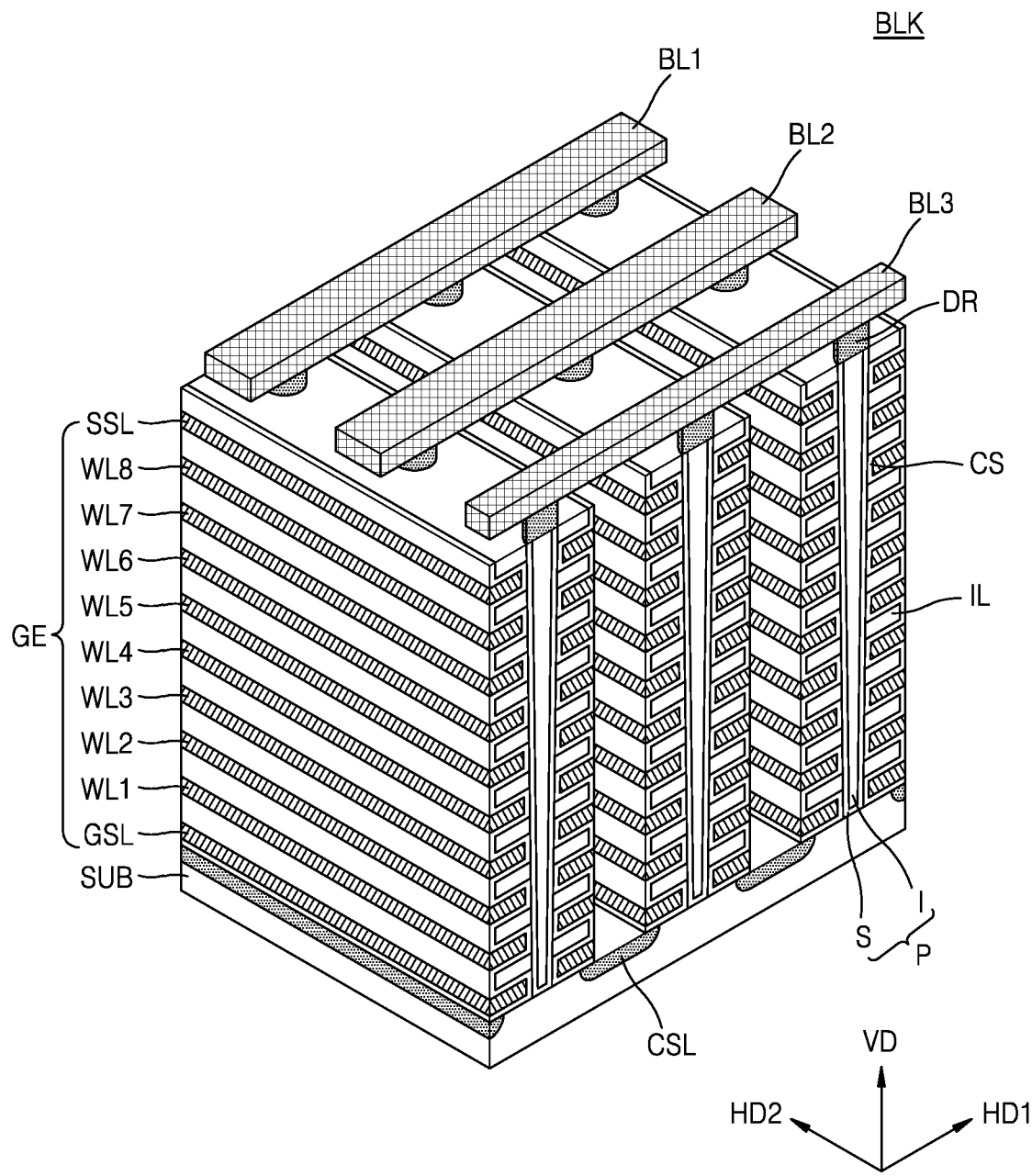
FIG. 5 is a perspective view further illustrating the memory block of FIG. 3 according to an embodiment of the inventive concept.

FIG. 5 is a perspective view further illustrating in one embodiment the memory block BLK of FIG. 4.

Referring to FIG. 5, the memory block BLK is formed in a vertical direction with respect to a principal substrate SUB. The substrate SUB has a first conductivity type (e.g., a P-type) and the common source lines CSL extending in the second horizontal direction HD2 and doped with impurities of a second conductivity type (e.g., an N-type) are provided on the substrate SUB. A plurality of insulating layers IL extending in the second horizontal direction HD2 are sequentially provided on a region of the substrate SUB between the two adjacent common source lines CSL in the vertical direction VD. The plurality of insulating layers IL are separate from each other by a certain distance in the vertical direction VD. For example, the plurality of insulating layers IL may include an insulating material such as a silicon oxide.

A plurality of pillars P sequentially arranged in the first horizontal direction HD1 and passing through the plurality of insulating layers IL in the vertical direction VD are provided on the region of the substrate SUB between the two adjacent common source lines CSL. For example, the plurality of pillars P pass through the plurality of insulating layers IL and contact the substrate SUB. Here, a surface layer S of each of the pillars P may include a silicon material having a first type and may function as a channel region. On the other hand, an internal layer I of each of the pillars P may include an insulating material such as a silicon oxide or an air gap.

In the region between the two adjacent common source lines CSL, a charge storage layer CS is provided along exposed surfaces of the insulating layers IL, the pillars P, and the substrate SUB. The charge storage layer CS may include a gate insulating layer (or, referred to as 'a tunneling insulating layer'), a charge trap layer, and a blocking insulating layer. For example, the charge storage layer CS may have an oxide-nitride-oxide (ONO) structure. In addition, in the region between the two adjacent common source lines CSL, a gate electrode GE such as the selecting lines GSL and SSL and the word lines WL1 to WL8 is provided on an exposed surface of the charge storage layer CS.

Drains or drain contacts DR are respectively provided on the plurality of pillars P. For example, the drains or the drain contacts DR may include a silicon material doped with impurities having the second conductivity type. The bit lines BL1 to BL3 extending in the first horizontal direction HD1 and arranged to be separate from each other by a certain distance in the second horizontal direction HD2 are provided on the drains or drain contacts DR.

Figure 6:
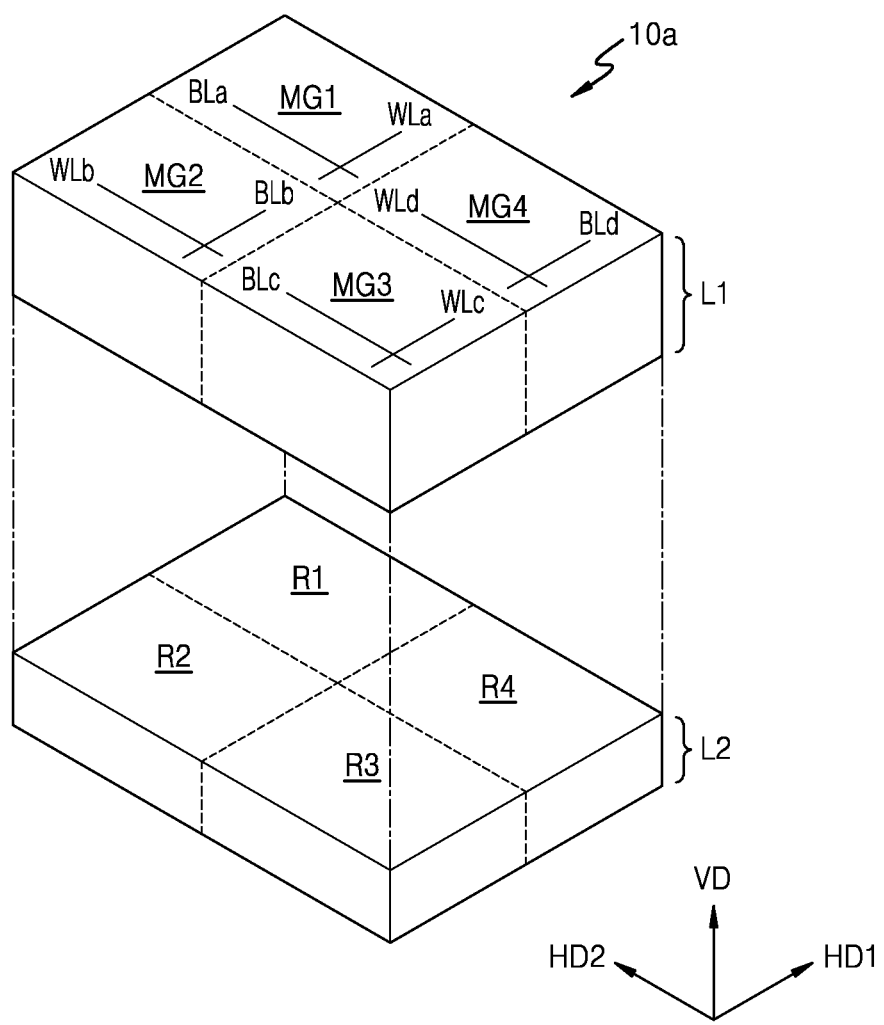
FIG. 6 is a perspective view of a memory device including four memory groups arranged in a first semiconductor layer that is stacked on top of a second semiconductor layer according to embodiments of the inventive concept.

FIG. 6 is a perspective view illustrating one possible structure for a memory device 10a including the first semiconductor layer L1 and the second semiconductor layer L2 according to embodiments of the inventive concept. The memory device 10a may correspond to the memory device 10 of FIGS. 1 and 2.

Referring to FIG. 6, a first memory group MG1 includes first word lines WLa extending in a first horizontal direction and first bit lines BLa extending in a second horizontal direction. A second memory group MG2 includes second word lines WLb extending in the second horizontal direction and second bit lines BLb extending in the first horizontal direction. A third memory group MG3 includes third word lines WLc extending in the first horizontal direction and third bit lines BLc extending in the second horizontal direction, and a fourth memory group MG4 includes fourth word lines WLd extending in the second horizontal direction and fourth bit lines BLd extending in the first horizontal direction. Expressed in other terms according to their respective arrangement of word lines and bit lines, the first memory group MG1 and the third memory group MG3 may be understood as "type A" memory groups, while the second memory group MG2 and the fourth memory group MG4 may be understood as "type B" memory groups. Of note with regard to the embodiment illustrated in FIG. 6, the type A and type B memory groups are arranged such that each type A memory group is "horizontally-adjacent"—either in the first horizontal direction or in the second horizontal direction—to a type B memory group. However, this need not always be the case in other arrangements of type A and type B memory groups are possible for other embodiments of the inventive concept.

Stated in other terms, the word lines of a type A memory group extend in the same horizontal direction as the bit lines of a type B memory group, or alternately, the bit lines of a type A memory group extend in the same horizontal direction as the word lines of a type B memory group in certain embodiments of the inventive concept.

Further, in certain embodiments of the inventive concept, a respective set of word lines (e.g., WLa, WLb, WLc and WLd) in a particular memory group (e.g., each one of MG1, MG2, MG3 and MG4) is electrically isolated from other memory group lines (i.e., is not electrically connected with a word line or bit line outside the particular memory group). Similarly, in certain embodiments of the inventive concept, a respective set of bit lines (e.g., BLa, BLb, BLc and BLd) in the memory groups (e.g., each one of MG1, MG2, MG3 and MG4) is electrically isolated from other memory group lines (i.e., is not electrically connected with another word line or bit line outside the particular memory group).

With respect to the arrangement of memory groups shown in FIG. 6, the second semiconductor layer L2 may include a first region R1 substantially underlying the first memory group MG1, a second region R2 substantially underlying the second memory group MG2, a third region R3 substantially underlying the third memory group MG3, and a fourth region R4 substantially underlying the fourth memory group MG4. Here, the qualifying term "substantially" is used to recognize expected variation(s) in memory group geometry relative to an underlying and corresponding peripheral circuitry region. Those skilled in the art will recognize that relatively small portions of an underlying region may extend beyond a boundary of an overlying and corresponding memory group, and/or relatively small portions of a memory group may extend beyond a boundary of an underlying and corresponding peripheral circuitry region. Such relatively small geometric mismatches nonetheless are subsumed in the terms "substantially underlying" and/or "substantially overlying", or more succinctly "underlying" or "overlying" to avoid unnecessary and repetitive use of the well understood terms.

Hence with reference to FIG. 6, the first region R1 underlies the first memory group MG1 in the vertical direction VD and has a "size" (e.g., a lateral area defined by a "length" measured in the second horizontal direction and a "width" measured in the first horizontal direction) substantially corresponding to the size of the first memory group MG1. In like manner, the second region R2 underlies the second memory group MG2 and has a size corresponding to the size of the second memory group MG2; the third region R3 underlies the third memory group MG3 and has a size corresponding to the size of the third memory group MG3; and, the fourth region R4 underlies the fourth memory group MG4 and has a size corresponding to the size of the fourth memory group MG4.

Figure 7:
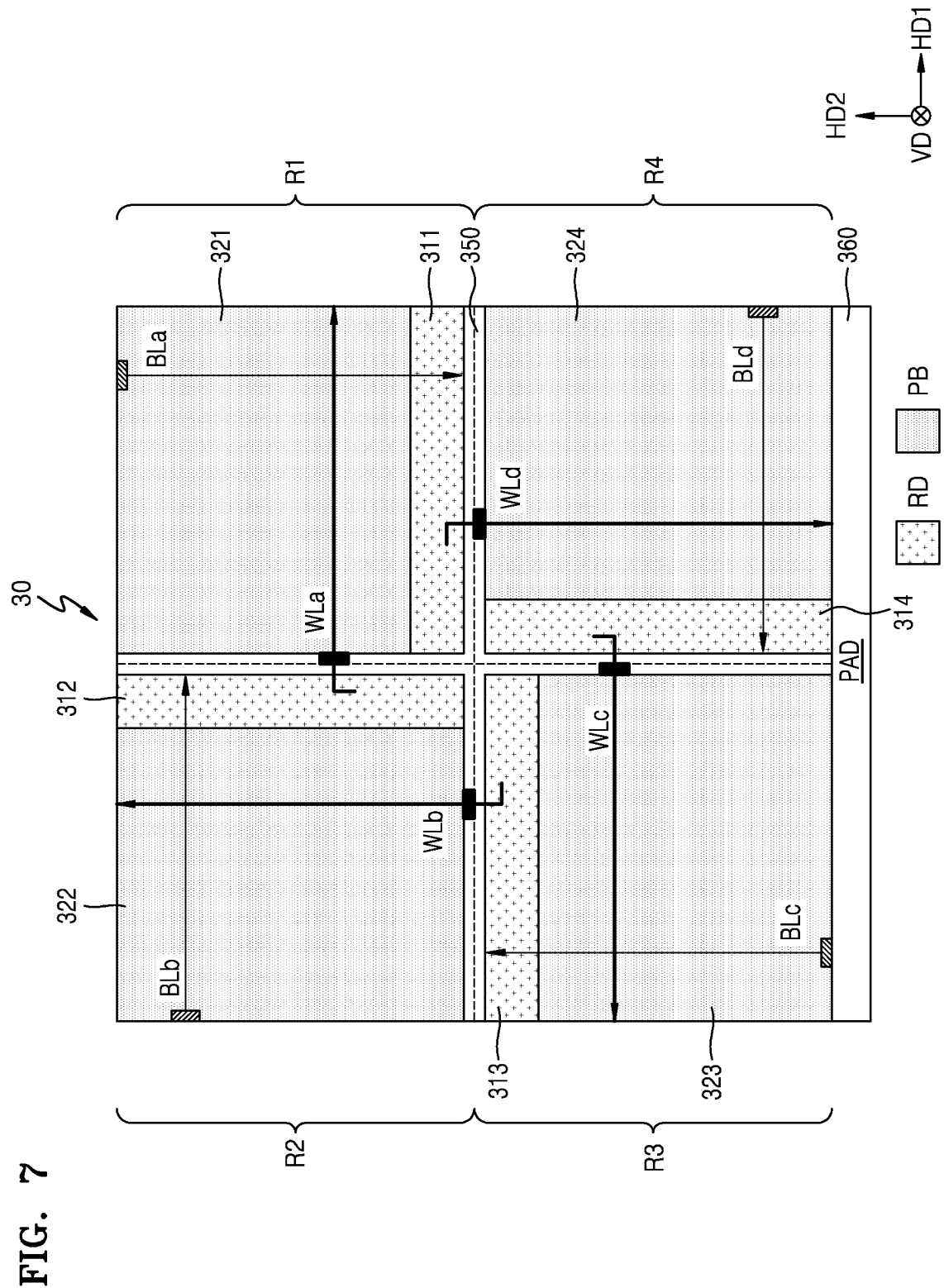
FIGS. 7, 8, 9, 10 and 11 respectively illustrate in various embodiments of the inventive concept an upper surface of the second semiconductor layer of FIG. 6.

FIG. 7 is plan view (i.e., top down view) illustrating an upper surface of a second semiconductor layer 30 according to an embodiment of the inventive concept. Here, the second semiconductor layer 30 may correspond to the second semiconductor layer L2 previously described.

Referring to FIG. 7 and consistent with the foregoing, the second semiconductor layer 30 includes first to fourth regions R1 to R4 which may respectively correspond to the first to fourth regions R1 to R4 of FIG. 6. Accordingly, the first to fourth memory groups MG1 to MG4 may be arranged to respectively overlie the first to fourth regions R1 to R4. Here, however, each peripheral circuitry region R1 to R4 includes a row decoder RD and a page buffer PB, wherein each page buffer PB is connected to memory cells (e.g., via bit lines) of a corresponding (i.e., an overlying) memory group, and each row decoder RD is connected to memory cells (e.g., via word lines) of an adjacent memory group. Here, the term "corresponding memory group" denotes a memory group vertically stacked on a particular region, while the term "adjacent memory group" denotes a memory group vertically stacked on a region that is horizontally-adjacent to the particular region.

Here, it should be noted that in certain embodiments of the inventive concept, the size of a page buffer PB may be greater in at least one dimension (width and/or height) than the size of a row decoder RD. For example, the size of a page buffer PB in both horizontal dimensions may be greater than one-half the size of a corresponding region (e.g., first to fourth regions R1 to R4).

Referring to the illustrated example of FIG. 7, a row decoder 311 and a page buffer 321 may be arranged in the first region R1. The row decoder 311 may be arranged in the horizontal direction HD1 in which the first word line WLa extends and may be arranged to be adjacent to the fourth region R4 in the second horizontal direction HD2. Further, the row decoder 311 may be arranged in a central portion of the second semiconductor layer 30 between the page buffer 321 and the fourth memory group MG4.

The first row decoder 311 is connected to memory cells of the fourth memory group MG4 (i.e., an adjacent memory group), while the first page buffer 321 is connected to memory cells of the first memory group MG1 (i.e., a corresponding memory group). That is, the page buffer 321 is connected to first bit lines BLa of the first memory group MG1 and may drive the first bit lines BLa. The row decoder 311 is connected to fourth word lines WLd of the fourth memory group MG4 and may drive the fourth word lines WLd. Hence, the fourth word lines WLd driven by the row decoder 311 are not included in the corresponding memory group (i.e., the first memory group MG1), but rather are included in an adjacent memory group (i.e., the fourth memory group MG4).

A second row decoder 312 and a second page buffer 322 are arranged in the second region R2, where the second row decoder 312 extends in the second horizontal direction HD2 between the second page buffer 322 and the first region R1. The second row decoder 312 is disposed in the central region of the second semiconductor layer 30 and connected to memory cells of the first memory group MG1, whereas the second page buffer 322 is connected to memory cells of the second memory group MG2.

A third row decoder 313 and a third page buffer 323 are arranged in the third region R3, where the third row decoder 313 extends in the first horizontal direction HD1 between the third page buffer 323 and the second region R2. The third row decoder 313 is disposed in the central region of the second semiconductor layer 30 and is connected to memory cells of the second memory group, whereas the third page buffer 323 is connected to memory cells of the third memory group MG3.

A fourth row decoder 314 and a fourth page buffer 324 are arranged in the fourth region R4, where the fourth row decoder 314 extends in the second horizontal direction HD2 between the fourth page buffer 324 and third region R3. The fourth row decoder 314 is disposed in the central region of the second semiconductor layer 30 and is connected to memory cells of the third memory group MG3, whereas the fourth page buffer is connected to memory cells of the fourth memory group MG4.

In the foregoing arrangement illustrated in FIGS. 6 and 7, respective row decoders may be connected to memory cells via horizontally adjacent word lines while respective page buffers may be connected to memory cells via corresponding bit lines. Further, respective regions (e.g., R1, R2, R3 and R4) may be electrically isolated from one another by one or more separation region(s) 350.

The illustrated embodiment of FIG. 7 assumes that the size of each row decoder RD and page buffer PB substantially occupies the corresponding region in at least one dimension (i.e., length or width). However, this need not always be the case and other embodiments of the inventive concept may include driving circuit(s) (e.g., a row decoder and/or a page buffer) having a size notably smaller than either the width or length of the corresponding region in the second semiconductor layer 30. It should be noted in this regard, however, that similar size dimension(s) (e.g., length and/or width)—as between respective memory groups and corresponding driving circuit(s)—may enable the fabrication of memory devices having relatively straight-forward (and therefore simple) wiring layouts. In contrast, mismatched size dimensions—as between respective memory groups and corresponding driving circuits—may require relatively complex wiring patterns. Nonetheless, recognizing this design trade-off those skilled in the art may opt for dimensionally smaller driving circuits in order to import additional peripheral circuitry (e.g., portions of the control logic 230) into one or more peripheral circuitry regions, R1 to R4.

Referring collectively to the illustrated embodiments and particularly those embodiments shown in FIGS. 7 through 11, 13, 15, 17 and 18, the second semiconductor layer (e.g., the second semiconductor layer 30 of FIG. 7) may further include a pad region PAD 360. In many memory device layouts consistent with embodiments of the inventive concept, the pad region 360 may be disposed along at least a portion of at one outer edge of the second semiconductor layer 30. A plurality of connection pads may be variously arranged in the pad region 360, wherein respective pads may be used to electrically connect various peripheral circuits dispose in the first to fourth regions R1 to R4 with external signal sources (e.g., a memory controller, processor or host device, not shown). In this regard, examples of externally provided signals include command signal(s) CMD, address signal(s) ADDR, and control signal(s) CTRL. The pads of the pad region 360 may be arranged to be relatively close to various peripheral circuit(s) processing externally provided signal(s) and/or signal(s) provided by one or more memory cell array(s) 100. Here, outer edges of the second semiconductor layer may extend in the first horizontal direction HD1 and/or the second horizontal direction HD2.

Similar to FIG. 7, FIGS. 8 through 11 are respective plan views illustrating an upper surface of a second semiconductor layer according to embodiments of the inventive concept.

Figure 8:
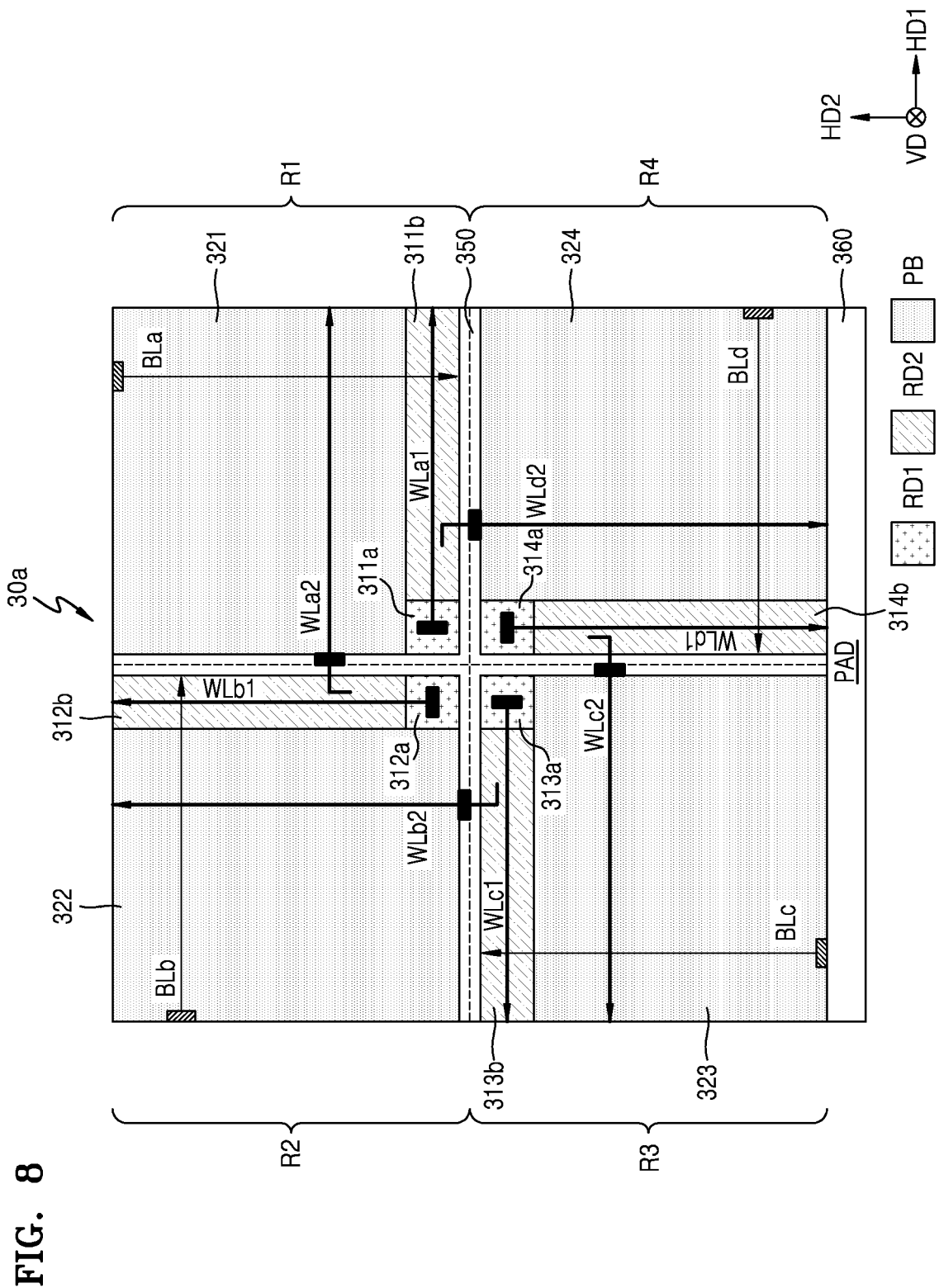

Referring to FIG. 8, a second semiconductor layer 30a may again include the first to fourth regions R1 to R4 respectively underlying a corresponding memory group among a plurality of memory groups disposed in a first semiconductor layer that is vertically stacked on the second semiconductor 30a. Again, each region R1 to R4 may include a row decoder and a page buffer. Only material difference(s) between the embodiment illustrated in FIG. 7 and the embodiment illustrated in FIG. 8 will be described in detail hereafter.

Of particular note, each row decoder illustrated in the embodiment of FIG. 8 (e.g., first row decoder 311 in the first region R1, second row decoder 312 in the second region R2, third row decoder 313 in the third region R3, and fourth row decoder 314 in the fourth region R4) is divided into a first portion (e.g., 311a in the first region R1, 312a in the second region R2, 313a in the third region R3, and 314a in the fourth region R4) and a second portion (e.g., 311b in the first region R1, 312b in the second region R2, 313b in the third region R3, and 314b in the fourth region R4).

In the embodiment of FIG. 8, the first region R1, second region R2, third region R3 and fourth region R4 are arranged substantially in a rectangle having a central (or inner) area near the conjunction of the four (4) regions and having a periphery (or outer) area surrounding the central area and proximate the outer edges of the rectangle. Assuming this arrangement, the respective first portions of the first row decoder 311, the second row decoder 312, the third row decoder 313, and the fourth row decoder 314 are centrally disposed in the rectangle, whereas the respective second portions of the first row decoder 311, the second row decoder 312, the third row decoder 313, and the fourth row decoder 314 extend from a corresponding first portion to an outer edge of the rectangle.

Further, each first portion of the first row decoder 311, the second row decoder 312, the third row decoder 313, and the fourth row decoder 314 is connected to memory cells of the corresponding memory group (e.g., via least one word line), while each second portion of the first row decoder 311, the second row decoder 312, the third row decoder 313, and the fourth row decoder 314 is connected to memory cells of an adjacent memory group (e.g., via at least one word line) similar to the row decoder connections previously described in relation to FIG. 7.

The respective page buffers (e.g., the first page buffer 321 in the first region R1, the second page buffer 322 in the second region R2, the third page buffer 323 in the third region R3, and the fourth page buffer 324 in the fourth region R4) are connected in a manner similar to that previously described in relation to FIG. 7.

Figure 9:
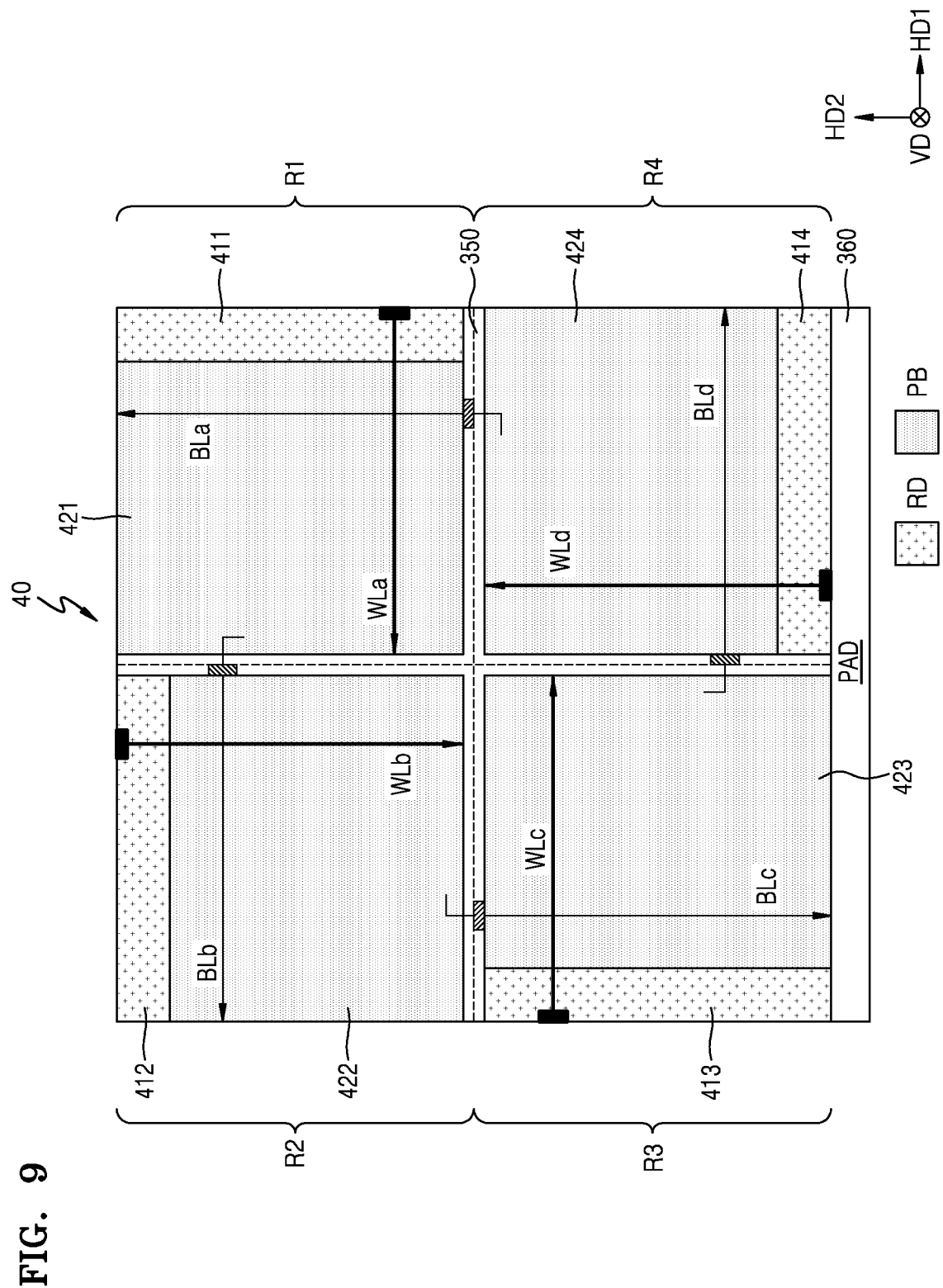

Referring to FIG. 9, a second semiconductor layer 40 may again include the first to fourth regions R1 to R4 respectively underlying a corresponding memory group from among memory groups disposed in a first semiconductor layer vertically stacked on the second semiconductor 40. Here again, each region includes a row decoder and a page buffer and only material difference(s) between the embodiments illustrated in FIGS. 7 and 8 and the embodiment illustrated in FIG. 9 will be described in detail.

Accordingly, the second semiconductor layer 40 of FIG. 9 includes the first to fourth regions R1 to R4, where each region includes a row decoder RD and a page buffer PB. However, unlike the embodiments of FIGS. 7 and 8 which centrally placed the row decoders between corresponding page buffers and horizontally adjacent regions, the embodiments of FIGS. 9, 10 and 11 centrally place respective page buffers, and therefore, place respective row decoders on an outer edge of the memory device. Further in this configuration, each row decoder may be connected to memory cells of the corresponding memory group, while each page buffer may be connected to memory cells of an adjacent memory group.

Accordingly, the size of each page buffer PB may be markedly greater than that size of a corresponding row decoder RD. That is, in certain embodiments of the inventive concept, the size of the respective page buffers PB may be greater than half of each corresponding region, (e.g., first to fourth regions R1 to R4).

In FIG. 9, a first row decoder 411 and a first page buffer 421 may be arranged in the first region RE The first row decoder 411 may be connected to memory cells of the first memory group MG1 (e.g., via at least one word line) and the first page buffer 421 may be connected to memory cells of the second memory group MG2 (e.g., via at least one bit line). Hence, the first row decoder 411 may be connected to a first word line WLa and drive the first word line WLa, while the first page buffer 421 may be connected to a second bit line BLb of the second memory group MG2 and may drive the second bit line BLb.

In similar manner, a second row decoder 412 and a second page buffer 422 may be arranged in the second region R2; a third row decoder 413 and a third page buffer 423 may be arranged in the third region, and a fourth row decoder 414 and a fourth page buffer 424 may be arranged in the fourth region.

Yet, here again, one driving circuit in a particular region is connected to memory cells of a corresponding memory group, while another driving circuit is the same particular region is connected to memory cells of a horizontally adjacent memory group.

Figure 10:
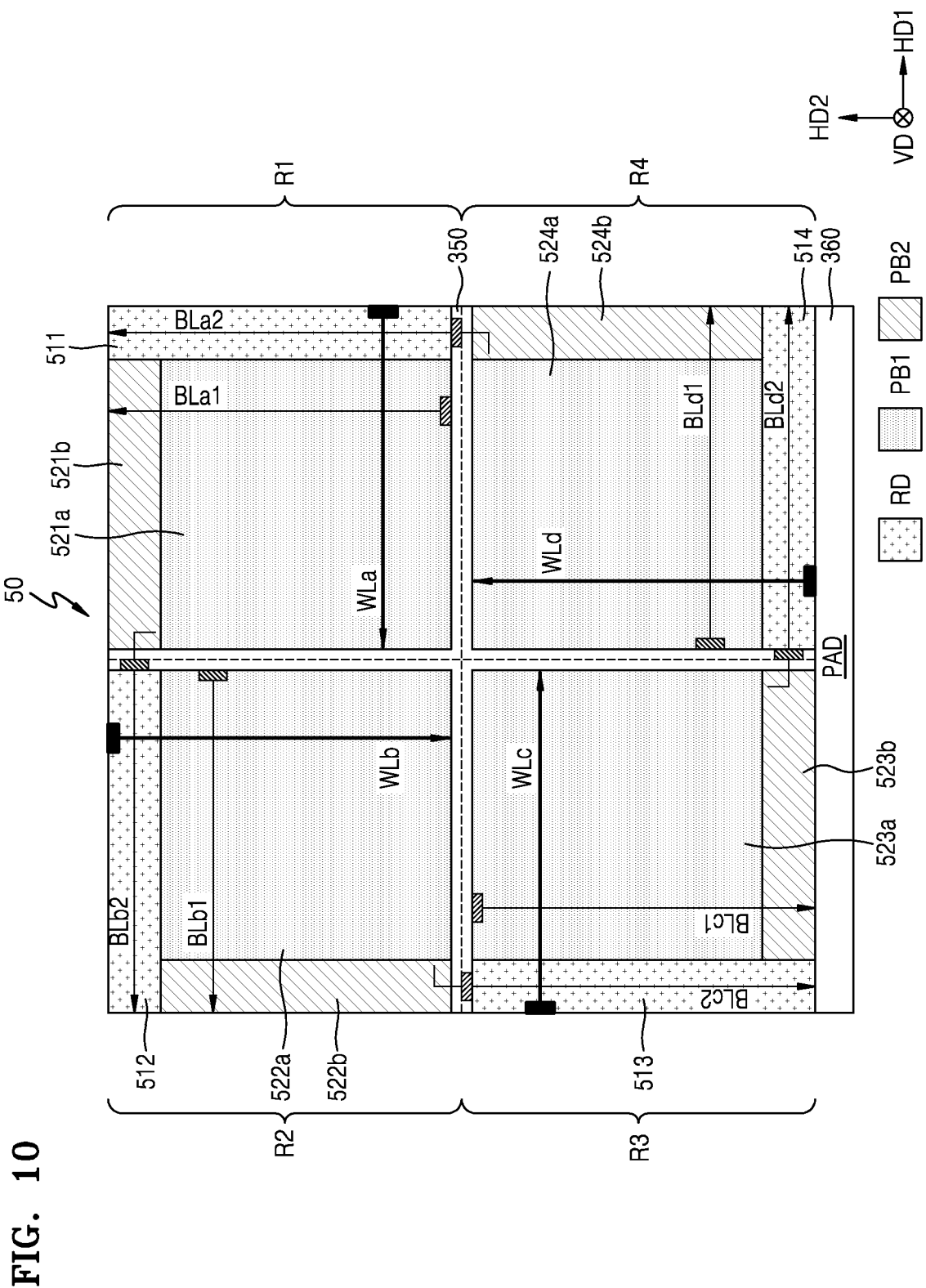

Referring to FIGS. 9 and 10, the embodiment illustrated in FIG. 9 may be modified as shown in FIG. 10 to include a page buffer in each region divided into first and second portions. So, in the first region R1 a first page buffer 521 includes a first portion 521a and a second portion 521b, wherein the first portion 521a is connected to memory cells of the corresponding memory group (i.e., the first memory group MG1) and the second portion 521b is connected to memory cells of an adjacent memory group (e.g., the second memory group MG2). Here, the first portion 521a may be connected to the memory cells of the first memory group via one or more bits lines, and the second portion 521b may be connected to the memory cells of the second memory group via one or more bits lines. In contrast, the first row decoder 511 is connected to memory cells of the corresponding memory group (e.g., via one or more word lines).

Similar arrangements are shown in FIG. 10 for the second row decoder 512 and the second page buffer 522 (including first portion 522a and second portion 522b) in the second region R2; the third row decoder 513 and the third page buffer 523 (including first portion 523a and second portion 523b) in the third region R3; and the fourth row decoder 514 and the fourth page buffer 524 (including first portion 524a and second portion 524b) in the fourth region R4.

Of note, each page buffer in its constituent portions, if so provided, may be disposed between a corresponding row decoder and an adjacent region, such that each row decoder is disposed along an outer edge of the region.

Figure 11:
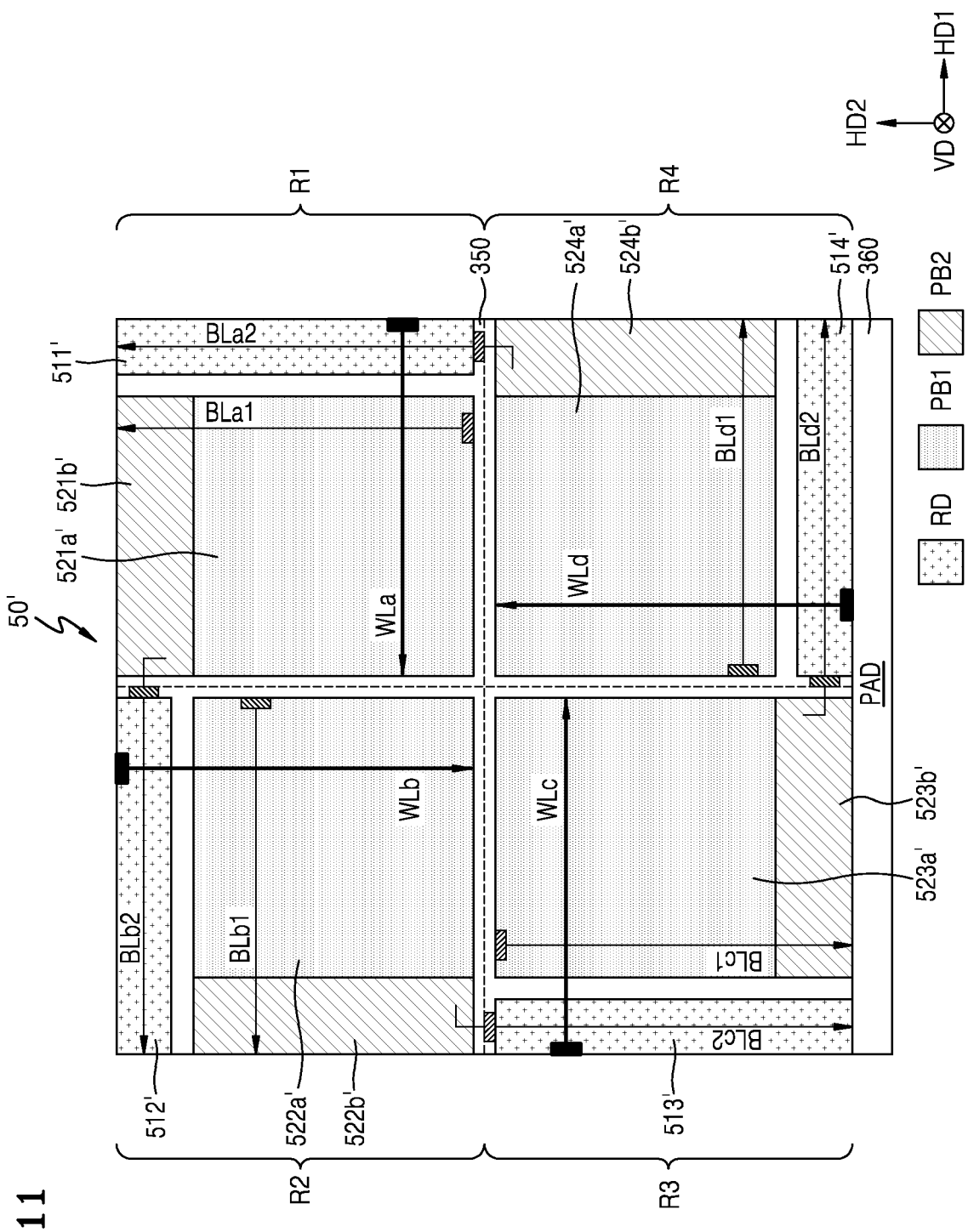

As further illustrated in FIG. 11, respective row decoders and page buffers disposed in a corresponding region may be electrically isolated from one another by the selective disposition or extension of separation region(s) 350.

As previously noted, the peripheral circuitry area 200 of a memory device according to embodiments of the inventive concept may include a great variety of peripheral circuits that regularly communicate command(s), address(es), and/or signal(s) with driving circuits and/or memory groups. To facilitate this communication of command(s), address(es), and/or signal(s), a plurality of pads may be arranged in the pad region 360 provided in relation to the second semiconductor layer. For example, a plurality of pads may be used to externally connect one or more of the first region R1, second region R2, third region R3 and fourth region R4.

Hence, column logic may be used to generate signal(s) driving one or more driving circuits (or driving circuit portions). A pre-decoder may generate signal(s) determining timing for signals applied to or provided by one or more circuits. A voltage generator (e.g., element 240 of FIG. 1) may be used to generate voltage(s) applied to one or more driving circuits or peripheral circuits in the memory device 10 (e.g., word line voltages, bit line voltages, reference voltages, power source voltages, etc.). A temperature sensor may sense a particular temperature associated with the memory device 10 and output a control signal corresponding to the sensed temperature to one or more driving circuits and/or peripheral circuits. A command decoder may decode a command signal CMD received from an external source and set an operating mode for the memory device 10 in accordance with the decoded command. An address decoder may decode an externally provided address signal ADDR, selected a memory block in response to the address, and activate the memory block. A moving zone controller may control an operation of applying various memory cell string voltages included in the memory cell array 100. A scheduler may include a processor or a state machine and may generate a plurality of control signals at proper timing in accordance with a mode set by the command Testing and/or measurement circuit may be used to test and/or measure characteristic(s) of the memory device 10 in order to provide characterization information or performance information about the memory device 10.

Heretofore, the illustrated embodiments of FIGS. 6 through 11 have assumed a two-by-two horizontal configuration of memory groups (MG1, MG2, MG3 and MG4) disposed in the first semiconductor layer L1 that is vertically stacked on the second semiconductor layer L2 including corresponding regions (R1, R2, R3 and R4). However, the scope of the inventive concept is not limited to only this two-by-two horizontal configuration of memory groups and corresponding regions.

Figure 12:
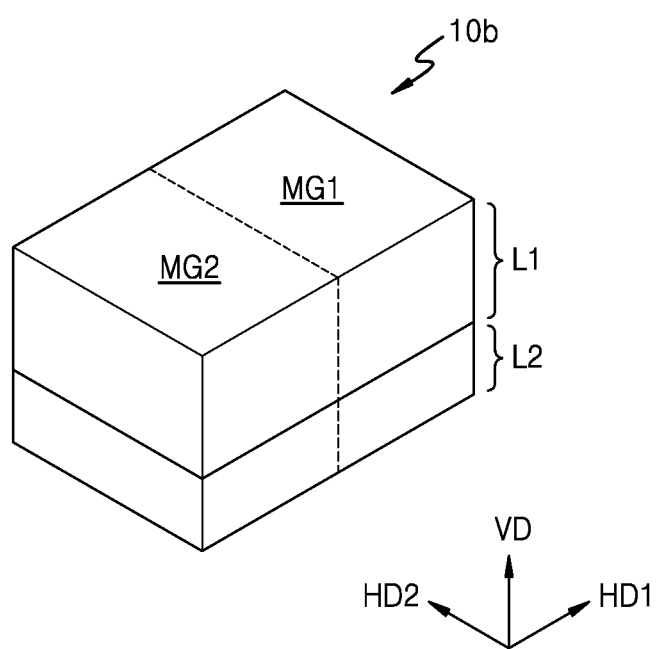
FIG. 12 is another perspective view of a memory device including two memory groups arranged in the first semiconductor layer according to embodiments of the inventive concept.
Figure 13:
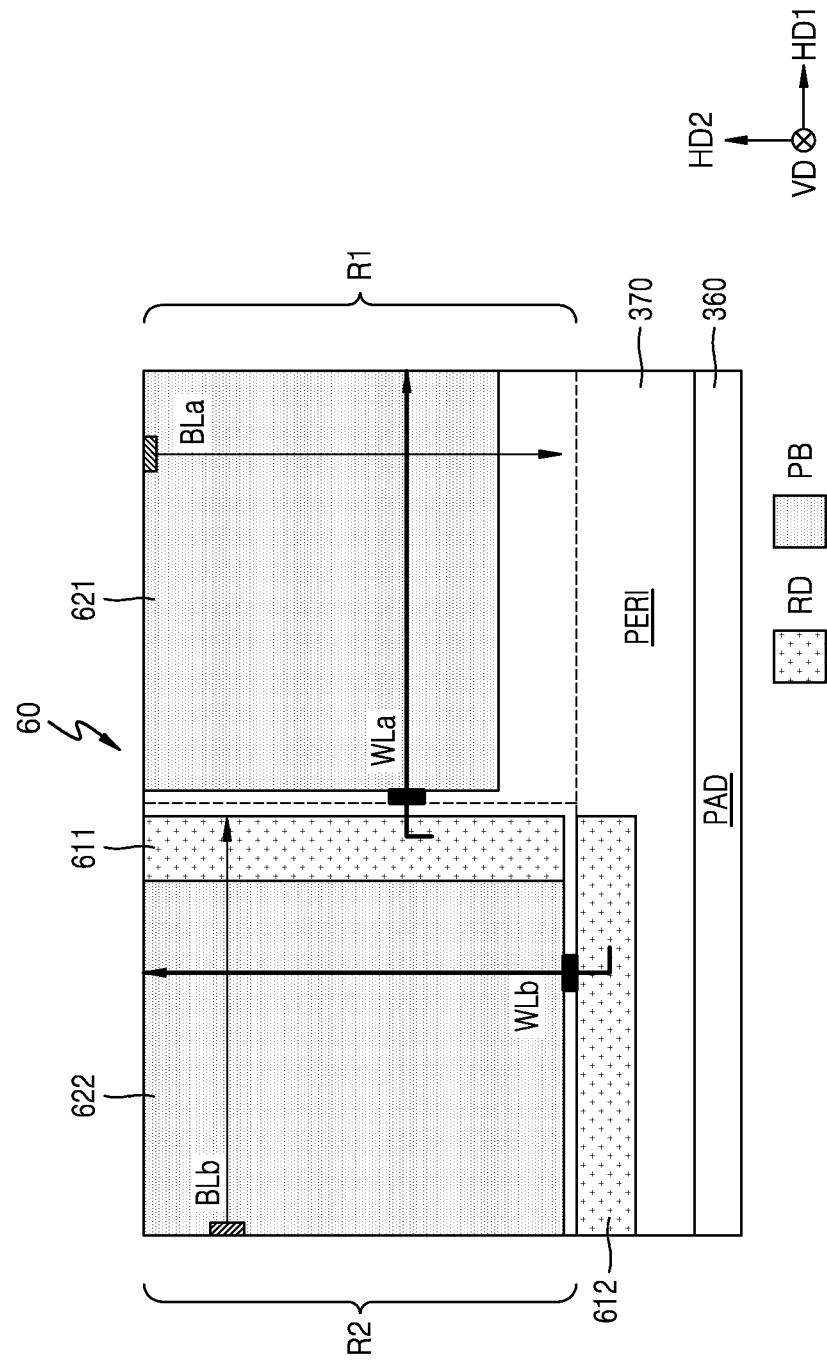
FIG. 13 illustrates an upper surface of the second semiconductor layer of FIG. 12 according to an embodiment of the inventive concept.

In the embodiment illustrated in FIGS. 12 and 13, a memory device 10B according to am embodiment of the inventive concept may include a first memory group MG1 and a second memory group MG2 horizontally adjacent to one another in the first semiconductor layer L1, and a first region R1 and a second region R2 disposed in the second semiconductor layer L2 and respectively underlying the first memory group MG1 and second memory group MG2.

More particularly in relation to the illustrated embodiment of FIG. 13, an upper surface of a second semiconductor layer 60 is shown. The first region R1 includes a first driving circuit (i.e., first page buffer 621) connected to memory cells of the corresponding memory group (i.e., the first memory group MG1) (e.g., through at least one bit line BLa). The second region R2 includes a second driving circuit (i.e., second page buffer 622) connected to memory cells of the corresponding memory group (i.e., the second memory group MG2) (e.g., through at least one bit line BLb), and a third driving circuit (i.e., first row decoder 611) connected to memory cells of the adjacent memory group (i.e., the first memory group MG2).

Additionally, the second semiconductor layer 60 includes a peripheral region (PERI) 370 extending across the length (or width) of both the first region R1 and the second region R2. The peripheral region 370 includes a fourth driving circuit (i.e., second row decoder 612) connected to memory cells of the adjacent memory group (i.e., the second memory group MG2). Here, the peripheral region may also include the pad region 360 previously described.

Figure 14:
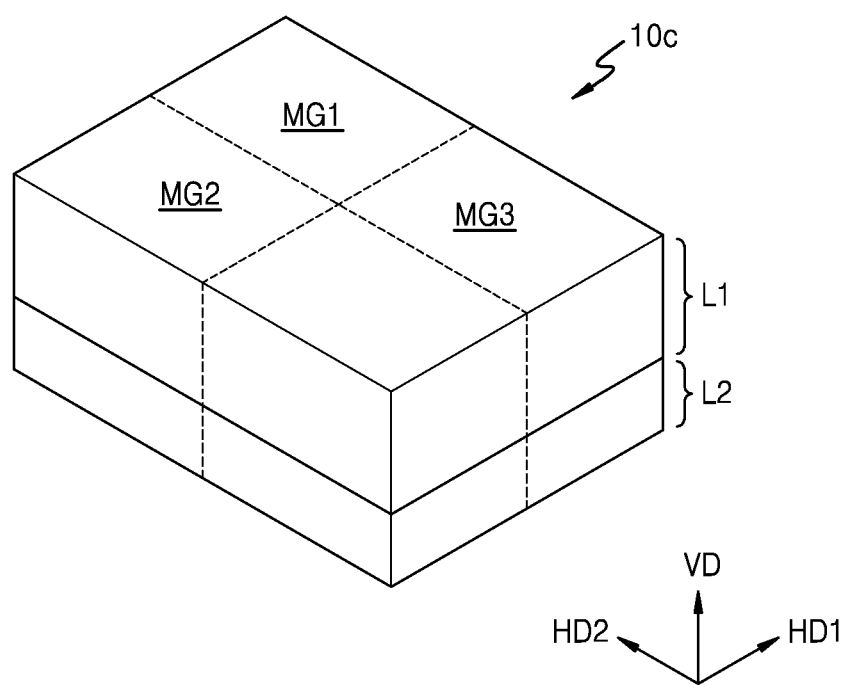
FIG. 14 is another perspective view of a memory device including three memory groups arranged in the first semiconductor layer according to embodiments of the inventive concept.

FIG. 14 illustrates still another memory device 10c according to an embodiment of the inventive concept including three (3) memory groups (MG1, MG2 and MG3) arranged in the first semiconductor layer L1.

Referring to FIG. 14, the first memory group MG1, second memory group MG2 and third memory group MG3 are arranged in the first semiconductor layer L1 in a manner similar to that previously described in relation to FIG. 6, where the first memory group MG1 is horizontally adjacent to the second memory group MG2 in the first horizontal direction HD1, and the first memory group MG1 is horizontally adjacent to the third memory group MG3 in the second horizontal direction HD2. However, no fourth memory group MG4 is provided in contrast to the embodiment of FIG. 6.

Figure 15:
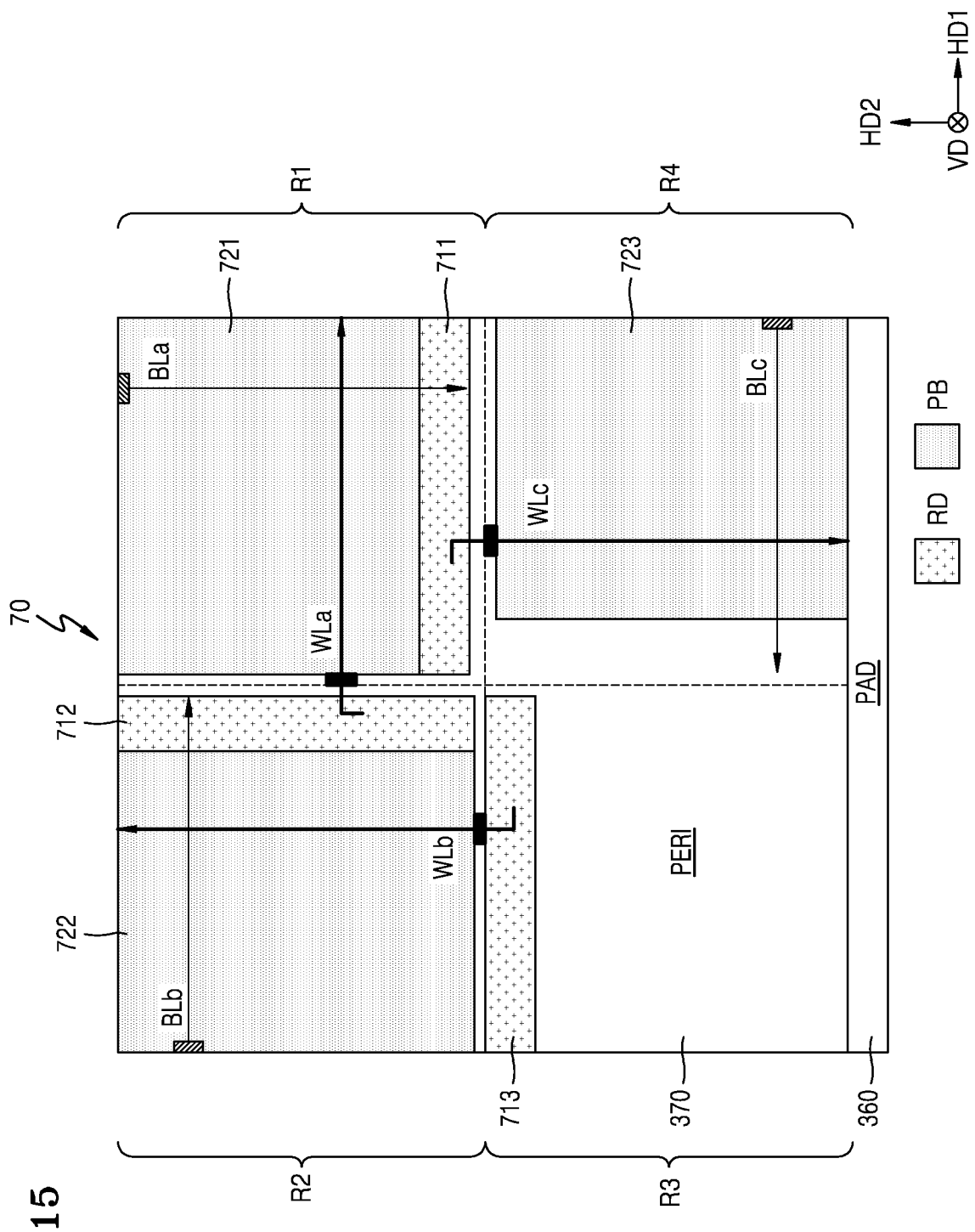
FIG. 15 illustrates an upper surface of the second semiconductor layer of FIG. 12 according to an embodiment of the inventive concept.

As illustrated in FIG. 15, the second semiconductor layer 70 may include a first region R1, a second region R2 and a third region R3, as well as a peripheral region 370 and a pad region 360. As before, the first region R1, second region R2 and third region R3 respectively underlie the first memory group MG1, second memory group MG2 and third memory group MG3. In the illustrated embodiment of FIG. 15, the first memory group may be a type A memory group, the second memory group may be a type B memory group, and the third memory group may also be a type B memory group.

The first region R1 includes a first row decoder 711 connected to memory cells of an adjacent memory group (i.e., the third memory group MG3) and a first page buffer 721 connected to memory cells of the corresponding memory group (i.e., the first memory group MG1). The second region R2 includes a second row decoder 712 connected to memory cells of an adjacent memory group (i.e., the first memory group MG1) and a second page buffer 722 connected to memory cells of the corresponding memory group (i.e., the second memory group MG2). The third region R3 includes a third row decoder 713 connected to memory cells of the corresponding memory group (i.e., the third memory group MG3). The peripheral region 370 includes a third row decoder connected to memory cells of an adjacent memory group (i.e., the second memory group MG2).

With this configuration, a substantial portion of the peripheral region 370 may be include one or more peripheral circuit types as suggested above. Accordingly, the embodiment of FIGS. 14 and 15 offers some added flexibility to the inclusion of various peripheral circuits into the second semiconductor layer L2 underlying the first semiconductor layer L1.

Figure 16:
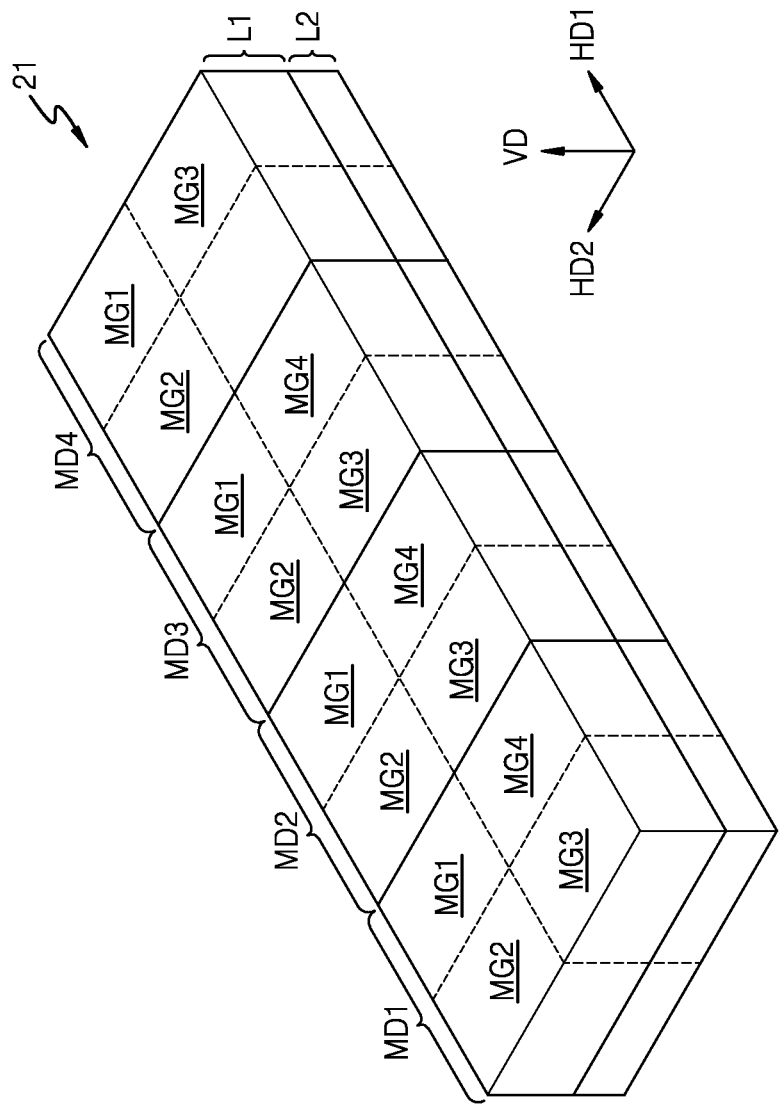
FIG. 16 is a perspective view of a memory component including a plurality of memory devices according to embodiments of the inventive concept.

FIG. 16 is a perspective view illustrating a memory component 21 including two or more memory devices like the ones previously described. The memory component 21 may include the second semiconductor L2 underlying the first semiconductor layer L1 consistent with the foregoing embodiments of the inventive concept.

Referring to FIG. 16, a first memory device MD1, a second memory device MD2 and a third memory device MD3 may be understood as a laterally arrangement (e.g., a lateral concatenation) of respective two-by-two horizontal memory devices like those previously described in relation to the embodiments of FIGS. 6 through 11. Additionally, the memory component 21 of FIG. 16 may include a fourth memory device MD4 like those previously described in relation to the embodiments of FIGS. 14 and 15.

Figure 17:
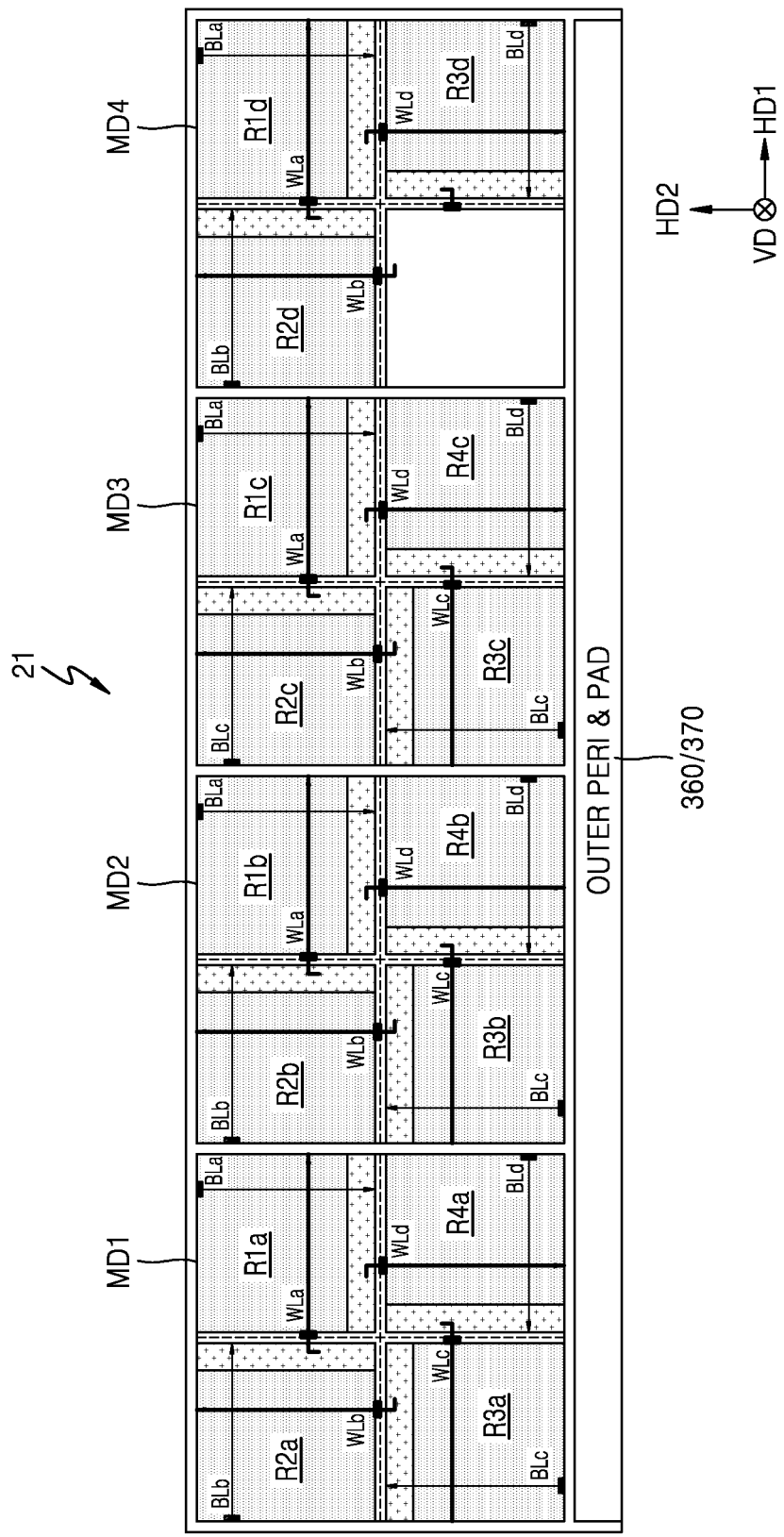
FIGS. 17 and 18 are respective plan views further illustrating different examples of an arrangement structure for the second semiconductor layer of FIG. 16.
Figure 18:
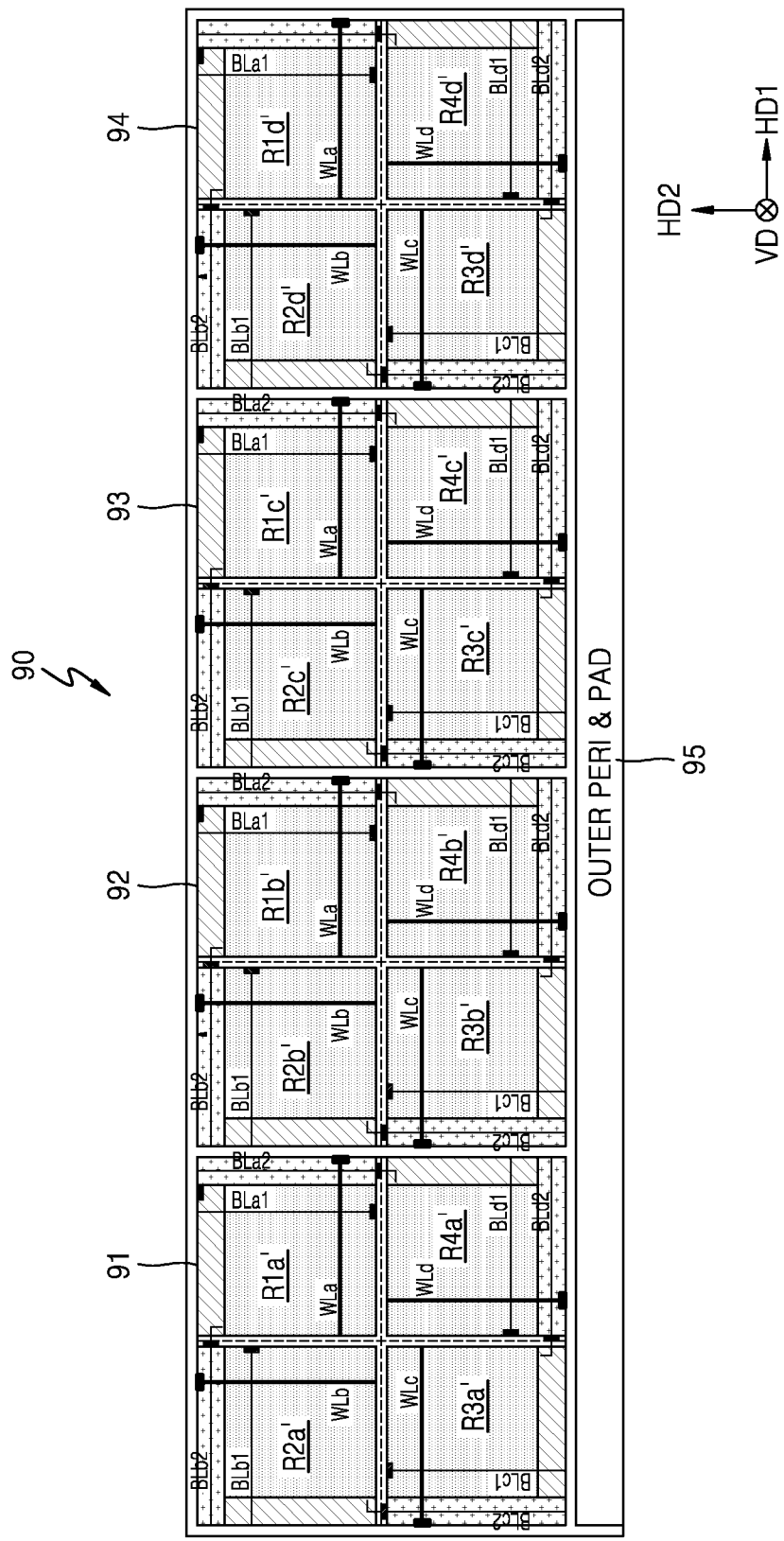

FIGS. 17 and 18 are respective plan views of the memory component 21 shown in FIG. 16. In FIG. 17, each one of the first memory device MD1, the second memory device MD2, the third memory device MD3, and the fourth memory device MD4 may include word lines and bit lines laid out in a manner consistent with the embodiments previously described in relation to FIGS. 6, 7 and 8. In FIG. 18, each one of the first memory device MD1, the second memory device MD2, the third memory device MD3, and the fourth memory device MD4 may include word lines and bit lines laid out in a manner consistent with the embodiments previously described in relation to FIGS. 9, 10 and 11.

With respect to the memory component 21 of FIGS. 16, 17 and 18, each one of the constituent memory devices (e.g., first memory device MD1, second memory device MD2, third memory device MD3, and fourth memory device MD4) may be independently operated in response to one or more command(s), address(es) and/or control signal(s). For example, the first memory device MD1 may perform a programming operation, while the second memory device MD2 and third memory device MD3 each perform respective read operations, while the fourth memory device remains idle or performs a housekeeping operation. In this regard, the first memory device MD1, second memory device MD2, third memory device MD3, and fourth memory device MD4 of the memory component 21 may share I/O bus(es), address bus(es), command bus(es), control signal(s) and/or signal connection pad(s).

In various embodiments of the inventive concept, the first to fourth memory groups MG1 to MG4 may be respectively and arbitrarily defined according to word line lengths (or word line widths), and bit line widths (or bit line lengths). Here, the resulting lengths and widths may be equal or different from one another. In this regard, a word line length (or word line width) may be expressed in terms of a shortest word line, a longest word line, or an intermediate word line in an arrangement of word lines (e.g., a vertically stacked arrangement of word lines). Similarly, a bit line length (or bit line width) may be expressed in terms of a shortest bit line, a longest bit line, or an intermediate bit line in an arrangement of bit lines.

Each memory group (e.g., MG1, MG2, MG3 and MG4), regardless of geometric definition or description, may be understood to certain embodiments of the inventive concept as corresponding to a tile. In this context, a "tile" may regarded as a lateral area (e.g., an area measured in terms of a first horizontal direction and a second horizontal direction) including a memory cell array and corresponding wiring (i.e., a memory group).

For example, a first tile may include a first memory group MG1 by including first word lines, first bit lines, and first memory cells in a distinct portion of the first semiconductor layer L1. Consistent with the foregoing embodiments, a first region R1 underlying the first tile may include a first driving circuit connected to memory cells of the corresponding memory group (e.g., the first memory group MG1 in the context of FIGS. 6 and 7) and a second driving circuit connected to memory cells of an adjacent memory group (e.g., one of the second memory group MG2, third memory group MG3 and fourth memory group MG4 in the context of FIGS. 6 and 7). In this exemplary context, the first region R1 underlies the first tile including the first memory group MG1, while the second region R2 underlies a second tile including the second memory group MG2.

Figure 19:
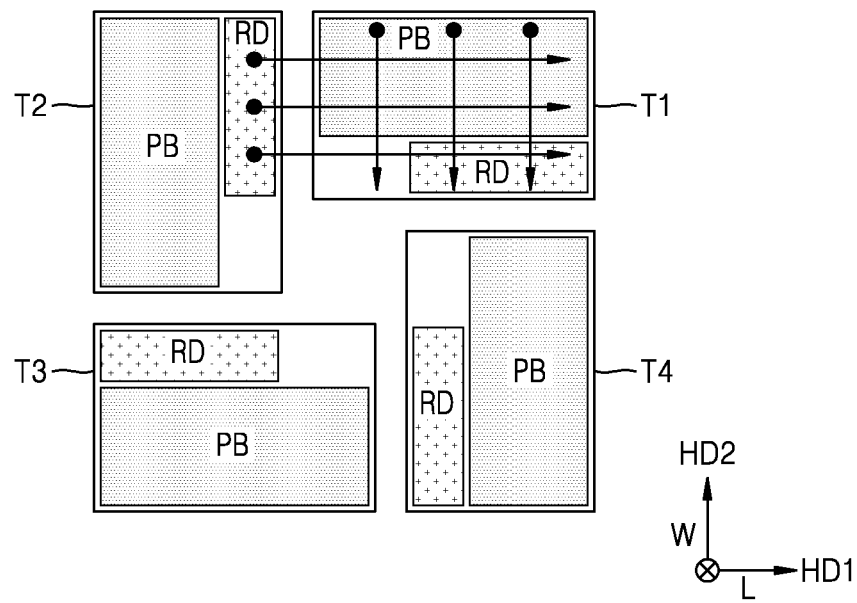
FIGS. 19 and 20 are respective plan views of different rectangular tile arrangements that may be used to configured memory devices according to embodiments of the inventive concept.

FIG. 19 is a conceptually view illustrating an exemplary, rectangular (or rectilinear) arrangement of tiles, each respectively including a corresponding memory group. For descriptive clarity, it is assumed that a first tile T1 includes the first memory group MG1 of FIG. 7, a second tile T2 includes the second memory group MG2 of FIG. 7, a third tile T3 includes the third memory group MG3 of FIG. 7, and a fourth tile T4 includes the fourth memory group MG4 of FIG. 7.

Referring to FIG. 19, the first tile T1, second tile T2, third tile T3 and fourth tile T4 are arranged in a rectangular pattern having aligned outer edges and a central voided area. Recognizing the desirability of straight-forward wiring between driving circuits and memory cells of connected memory groups, the second row decoder disposed under the second tile T2, for example, may have a width in the second horizontal direction HD2 that is substantially equal to a width of the first memory group MG1 in the first tile T1. In like manner, a first page decoder disposed under the first tile T1 may have a length in the first horizontal direction HD1 that is substantially equal to the length of the first memory group MG1. Such substantially equivalent widths and lengths—as between memory groups and connected driving circuits—yields relatively uncomplicated wiring layouts and an efficient use of available lateral area.

Figure 20:
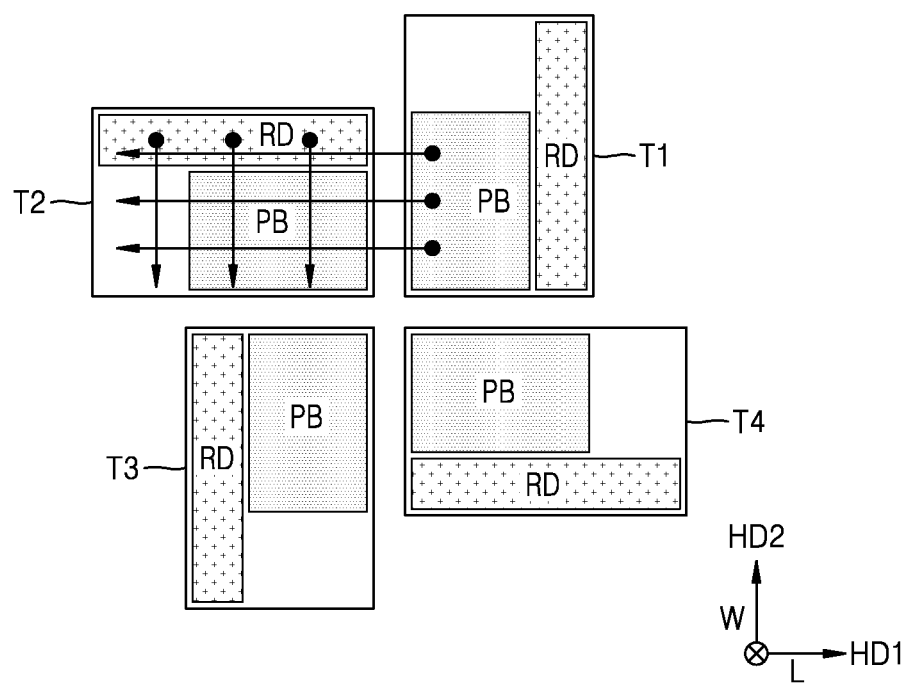

The embodiment illustrated in FIG. 20 shows another rectangular (or rectilinear) arrangement of tiles. Thus, FIG. 20 is another conceptually view illustrating an exemplary arrangement of tiles, each respectively including a corresponding memory group. Here, however, it is assumed that a first tile T1 includes the first memory group MG1 of FIG. 9, a second tile T2 includes the second memory group MG2 of FIG. 9, a third tile T3 includes the third memory group MG3 of FIG. 9, and a fourth tile T4 includes the fourth memory group MG4 of FIG. 9.

Referring to FIG. 20, the first tile T1, second tile T2, third tile T3 and fourth tile T4 are arranged in a rectangular pattern having aligned inner edges. Again recognizing the desirability of straight-forward wiring between driving circuits and the memory cells of connected memory groups, the second row decoder disposed under the second tile T2 may have a length in the first horizontal direction HD1 that is equal to the length of the second memory group MG1 corresponding to the second tile T2. In like manner, the first page decoder disposed under the first tile T1 may have a width in the second horizontal direction HD2 that is equal to the width of the second memory group MG2.

Figure 21:
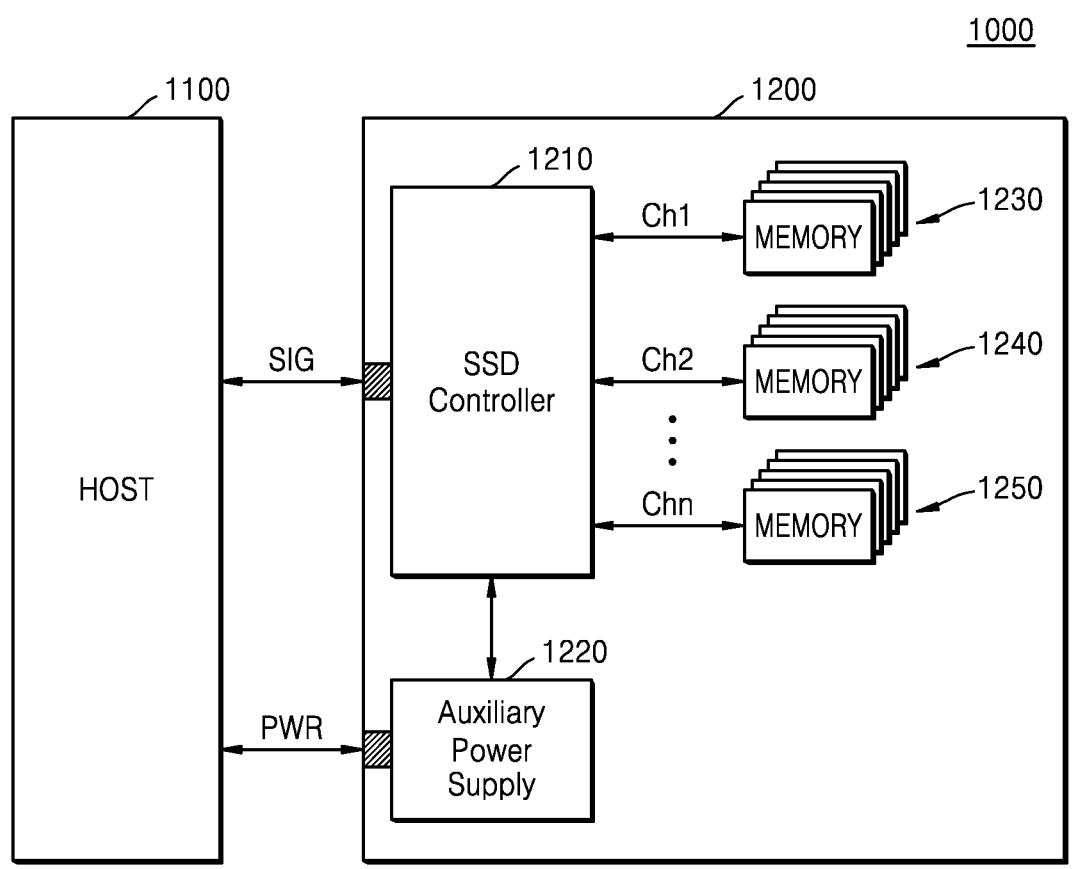
FIG. 21 is a block diagram illustrating a solid-state drive (SSD) system that may incorporate a memory device or memory component according to embodiments of the inventive concept.

FIG. 21 is a block diagram illustrating a solid-state drive (SSD) system 100 according to embodiments of the inventive concept that may incorporate one or more memory devices consistent with the foregoing embodiments.

Referring to FIG. 21, the SSD system 1000 may include a host 1100 and an SSD 1200. The SSD 1200 transmits and receives a signal to and from the host 1100 through a signal connector and receives a power source through a power connector. The SSD 1200 may include an SSD controller 1210, an auxiliary power supply 1220, and memories 1230, 1240, and 1250. The memories 1230, 1240, and 1250 may be vertically stacked NAND flash memories of the type previously described in relation to FIGS. 1 to 18.

Heretofore, exemplary memory devices and memory systems have been described that assume the use of flash memory cells. However as previously noted, the inventive concept encompasses a range of memory devices and memory systems.

Figure 22:
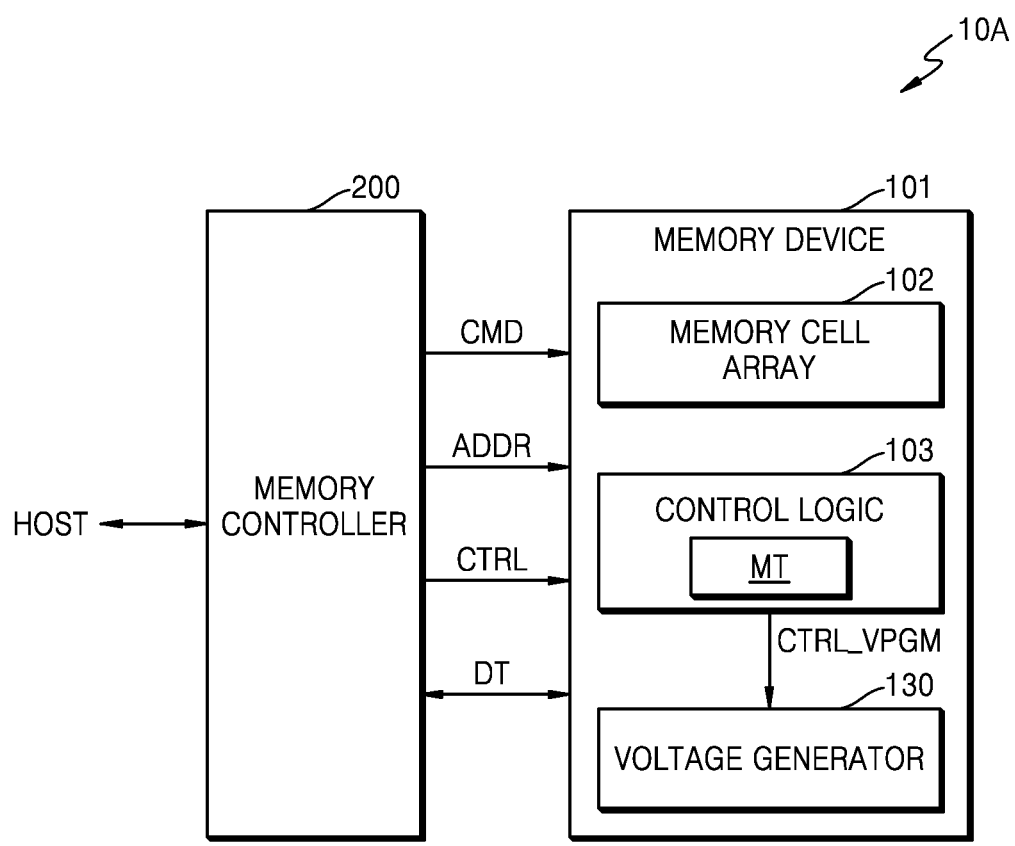
FIG. 22 is a block diagram illustrating a memory system 10A including a memory device 101 including a resistive memory cell array 102 according to certain embodiments of the inventive concept.

For example, FIG. 22 generally illustrates a memory system 10A including a non-volatile memory device 101 and a memory controller 200, where the non-volatile memory device 101 may include a memory cell array 102 including resistive memory cells.

Here, the memory device 101 may include in addition to the memory cell array 102, control logic 120, and a voltage generator 130. The memory cell array 112 may include an arrangement (e.g., a matrix) of resistive memory cells. Accordingly, the memory device 101 may be referred to as a resistive memory device.

The memory controller 200 may be used to control the overall operation of the resistive memory device 101 during read, write and erase operations in response to various commands received from a host (not shown). That is, the memory controller 200 may control read, write, and erase operations executed by the memory device 101 by providing one or more address(es) ADDR, command(s) CMD, and/or control signal(s) CTRL to the resistive memory device 100. In addition, program (or write) data DT and/or read data DT may be communicated (i.e., transmitted and/or received) between the memory controller 200 and the resistive memory device 101.

As may be appreciated by those skilled in the art, the memory cell array 102 may respectively arrange the resistive memory cells in relation to a plurality of word lines and a plurality of bit lines. In this regard, the resistive memory device 101 may be referred to as a cross point memory. During a memory access operation (e.g., a write operation) the parasitic resistance of a selected (or target) memory cell may differ according to its position within the resistive memory cell array 102. Specifically, the length of a conductive line between the selected memory cell and a driving circuit (e.g., a word line select switch or a bit line select switch) may differ according to the relative position of the selected memory cell, thereby varying the corresponding parasitic resistance.

In certain embodiments of the inventive concept, the memory cells of the resistive memory cell array 102 may include variable resistance elements. For example, when the variable resistance element includes a phase change material (Ge—Sb—Te (GST)) and has a resistance changing according to a temperature, the memory device 101 may be a phase-change random access memory (PRAM). As another example, when the variable resistance element includes an upper electrode, a lower electrode, and a complex metal oxide therebetween, the memory device 101 may be a resistive random access memory (ReRAM). As another example, when the variable resistance element includes a magnetic upper electrode, a magnetic lower electrode, and a dielectric therebetween, the memory device 101 may be a magnetic random access memory (MRAM). Hereinafter, an embodiment in which the memory device 101 is a PRAM will be described as a more detailed example.

The control circuitry 103 may generate a program voltage control signal CTRL_VPGM appropriate to adjust a program voltage of a selected memory cell in response to a write command and an address ADDR. In one example, the control circuitry 103 may generate the program voltage control signal CTRL_VPGM corresponding to the address of the selected memory cell as indicated by a mapping table MT associated with the control logic 103. For example, the mapping table MT may define a parasitic resistance corresponding to an address ADDR for each of the memory cells in the resistive memory cell array 102. That is, the mapping table MT may be stored in a register of the control logic 103. However, embodiments of the inventive concept are not limited thereto. The mapping table MT may be stored external to the control circuitry 103 an anti-fuse, for example.

Referring again to FIG. 22, the voltage generator 130 may generate a program voltage having a first program voltage level, which is one of a plurality of program voltage levels, based on the program voltage control signal CTRL_VPGM. The plurality of program voltage levels may correspond to a plurality of predefined parasitic resistances. Accordingly, the number of program voltage levels may correspond to the number of parasitic resistances stored in the mapping table MT. In this manner, the voltage generator 130 may generate the program voltage corresponding to the first program voltage level among the program voltage levels based on position information of the selected memory cell among the memory cells and the cell resistance distribution of the memory cells. In one embodiment, the voltage generator 130 may generate the program voltage before the program operation of the memory cell array 102 is started. In other words, the program voltage may be set before a program current is applied to the selected memory cell.

In some embodiments, the memory system 10A may be implemented as an internal memory embedded within an electronic device. For example, the memory system 10A may be a universal flash storage (UFS) memory device, an embedded multimedia card (eMMC), or a solid state drive (SSD) like the one described in relation to FIG. 21. In some embodiment, the memory system 10A may be implemented by an external memory detachable from an electronic device. For example, the memory system 10A may be implemented as a UFS memory card, a compact flash (CF) card, a secure digital (SD) card, a micro secure digital (micro-SD) card, a mini secure digital (mini-SD) card, an extreme digital (xD) card, or a memory stick.

Figure 23:
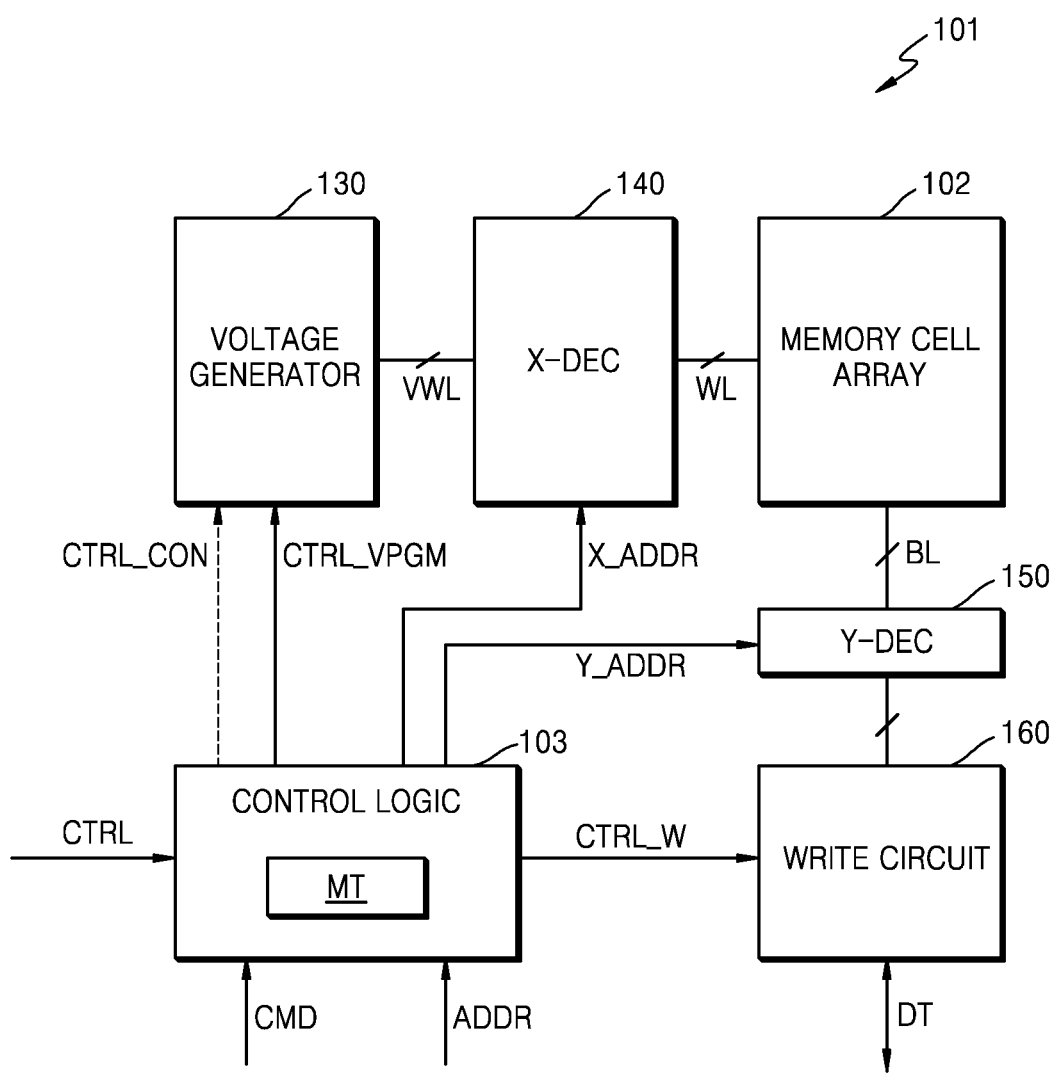
FIG. 23 is a block diagram further illustrating in one embodiment the memory device 101 of FIG. 22.

FIG. 23 is a block diagram further illustrating in one embodiment the memory device 101 of FIG. 22.

Referring to FIG. 23, the memory device 101 may include in addition to the resistive memory cell array 102, a control circuitry 120, the voltage generator 130, a row decoder 140, a column decoder 150, and a write circuit 160.

The resistive memory cell array 102 may be connected to the row decoder 140 through word lines WL, and may be connected to the column decoder 150 through bit lines BL. The memory cells of the resistive memory cell array 102 may be further arranged in a plurality of memory groups. And, as may be appreciated by those skilled in the art, each respective memory group may be variously defined as including one or more bank(s), bay(s), tile(s), sub tile(s), etc.

The control logic 103 may be used to output various control signals (e.g., a program voltage control signal CTRL_VPGM, a row address X_ADDR, a column address Y_ADDR, and a write control signal CTRL_W, etc.), such that program data to-be-programmed to the resistive memory cell array 102, read data retrieved from the resistive memory cell array 012, and/or erase data stored in the resistive memory cell array 110 may be identified in accordance with a received command CMD, address ADDR, and/or control signal CTRL. In this manner, the control logic 103 may be used to control the overall operation of the memory device 101.

Consistent with the preciously described embodiments, the control logic 103 of FIGS. 22 and 23 may be used to generate the connection control signal CTRL_CON for activating the voltage generator 130 in response to the write command, for example. The control logic 103 may thus provide the connection control signal CTRL_CON to the voltage generator 130 and then provide the program voltage control signal CTRL_VPGM to the voltage generator 130. When the connection control signal CTRL_CON is activated, a current path in the voltage generator 130 may be activated.

The voltage generator 130 may generate various types of voltages for performing program, read, and erase operations on the memory cell array 110, based on various voltage control signals received from the control logic 103. Specifically, the voltage generator 130 may generate a word line voltage VWL, for example, a program voltage, a read voltage, a pass voltage, an erase verify voltage, or a program verify voltage.

The row decoder 140 may select one of a plurality of word lines WL in response to the row address X_ADDR. For example, the row decoder 140 may include a plurality of word line select switches or row select switches respectively connected to a plurality of word lines WL. The row select switches may be driven in response to the row address X_ADDR. The row decoder 140 may be configured to provide the program voltage to a selected word line connected to the selected memory cell among the word lines WL.

The column decoder 150 may select one of a plurality of bit lines BL in response to the column address Y_ADDR. For example, the column decoder 150 may include a plurality of bit line select switches or column select switches respectively connected to a plurality of bit lines BL. The column select switches may be driven in response to the column address X_ADDR. The column decoder 150 may be configured so that a selected bit line connected to the selected memory cell among the bit lines BL is electrically connected to the write circuit 160.

The write circuit 160 may be configured to receive a write control signal CTRL_W from the control circuitry 120, and provide a program current to the selected bit line in response to the write control signal CTRL_W. In one embodiment, the program current may have a fixed value. In this regard, the write circuit 160 may be referred to as a write driver. Although not illustrated, the memory device 100 may further include a read circuit. The read circuit may include a sense amplifier that amplifies data read from the selected memory cell.

Figure 24:
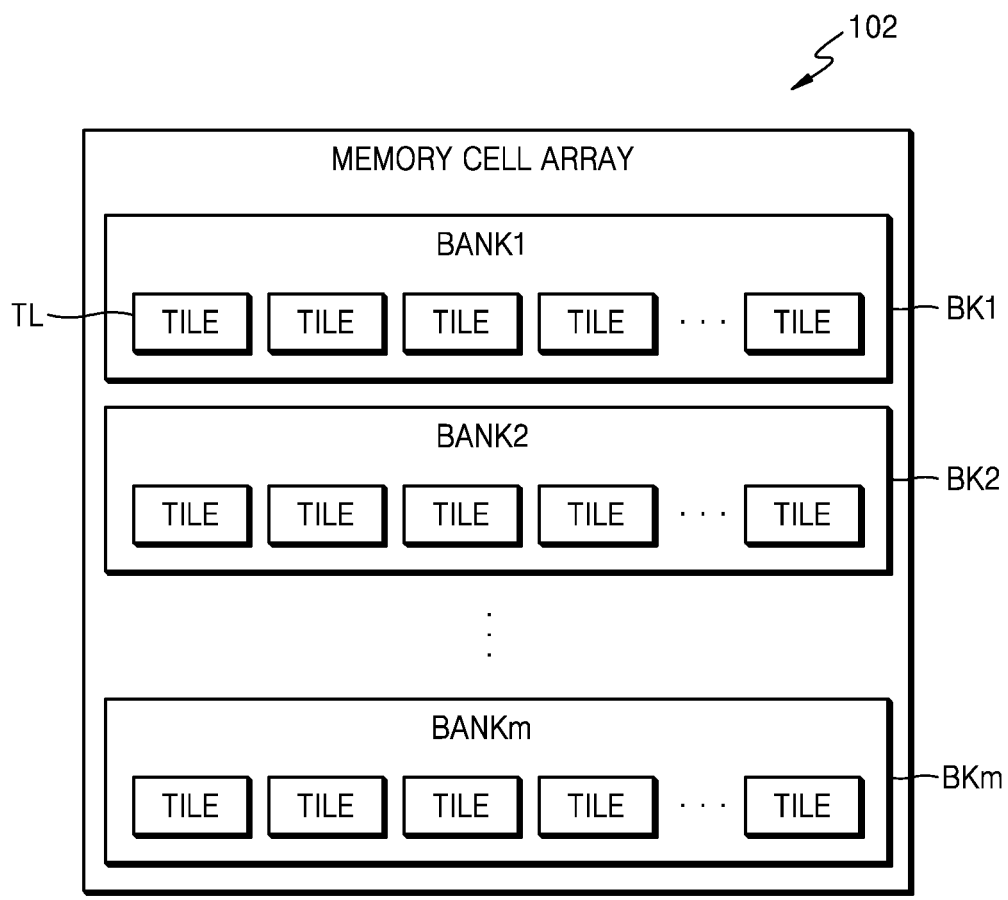
FIG. 24 is a block diagram further illustrating in one embodiment the resistive memory cell array 102 of FIGS. 22 and 23.

FIG. 24 is a block diagram further illustrating in one embodiment the resistive memory cell array 102 of FIGS. 22 and 23.

Referring to FIG. 24, the resistive memory cell array 102 may include a plurality of banks BK1, BK2, and BKm. For example, the banks BK1, BK2, and BKm may be arranged in one direction of the resistive memory cell array 102. For example, the resistive memory cell array 102 may include 'm' banks, where 'm' is an integer greater than one. Each of the banks BK1, BK2, and BKm may include a plurality of tiles TL. In certain embodiments of the inventive concept, the respective memory groups previously described may correspond to a particular bank of the resistive memory cell array 102, or alternately, to a tile or a bay within the resistive memory cell array 102, where the term "bay" denotes a plurality of tiles.

Figure 25:
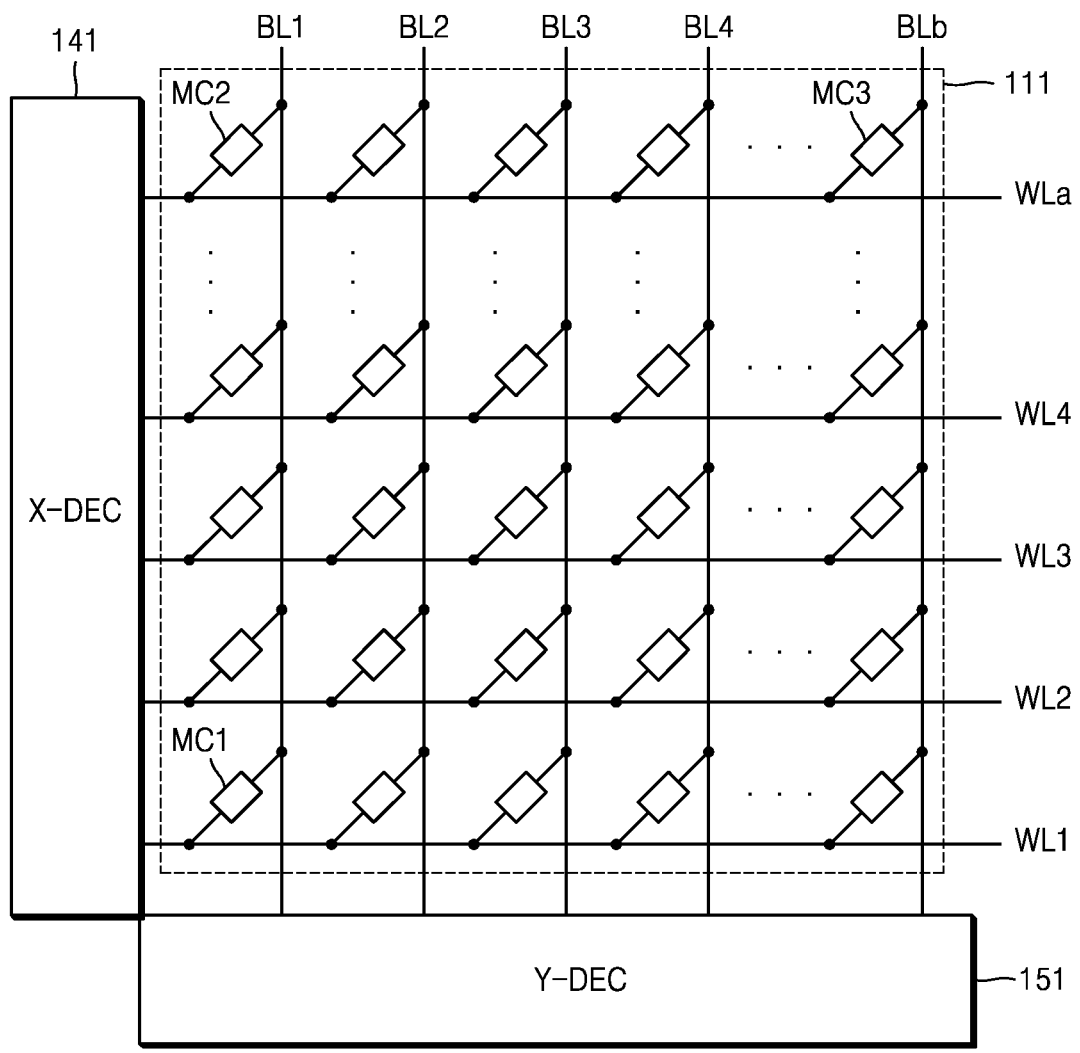
FIG. 25 illustrates an exemplary memory group 111 including a plurality of memory cells according to an embodiment of the inventive concept.
Figure 25:
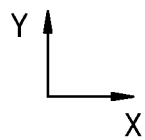

FIG. 25 illustrates an exemplary memory group 111 including a plurality of memory cells according to an embodiment of the inventive concept.

Referring to FIG. 25, the memory group 111 is arranged in relation to a plurality of word lines WL1 to WLa and a plurality of bit lines BL1 to BLb, and includes a plurality of resistive memory cells MC. The resistive memory cells MC may be respectively arranged in regions in which the word lines WL1 to WLa and the bit lines BL1 and BLb cross each other. Assuming the use of this descriptive nomenclature for the word lines and bit lines, the variables 'a' and 'b' may be the same or different.

The memory group 111 may be disposed proximate (e.g., adjacent to) the row decoder 141 in a first direction (e.g., an X direction), and proximate the column decoder 151 in a second direction (e.g., a Y direction). As such, the memory group 111 operationally accessed by use of the row decoder 141 and column decoder 151 as a defined "tile". That is, a particular tile may be defined in accordance with a row decoder 141 connection of word line(s) WL1 to WLa and a column decoder 151 connection of bit line(s) BL1 to BLb. The parasitic resistance of a resistive memory cell MC will vary in accordance with its position within the memory group 111.

Within the illustrated memory group 111 of FIG. 25, a first memory cell MC1 is disposed in a region in which the first word line WL1 and the first bit line BL1 cross each other, and a second memory cell MC2 is disposed in a region in which the $a^{th}$ word line WLa and the first bit line BL1 cross each other. Here, the relative distances between the first and second memory cells MC1 and MC2 and the row decoder 141 may be substantially the same. However, the distance between the second memory cell MC2 and the column decoder 151 is materially greater than the distance between the first memory cell MC1 and the column decoder 151. Hence, during a program (or write) operation, the parasitic resistance of the second memory cell MC2 may be greater than the parasitic resistance of the first memory cell MC1.

Again referring to FIG. 25, a third memory cell MC3 is disposed in a region in which the $a^{th}$ word line WLa and the $b^{th}$ bit line BLb cross each other. In this case, the distances between the second and third memory cells MC2 and MC3 and the column decoder 151 may be substantially the same, but the distance between the third memory cell MC3 and the row decoder 141 is greater than the distance between the second memory cell MC2 and the row decoder 141. Therefore, during a program (or write) operation, the parasitic resistance of the third memory cell MC3 may be greater than the parasitic resistance of the second memory cell MC2.

Figure 26A:
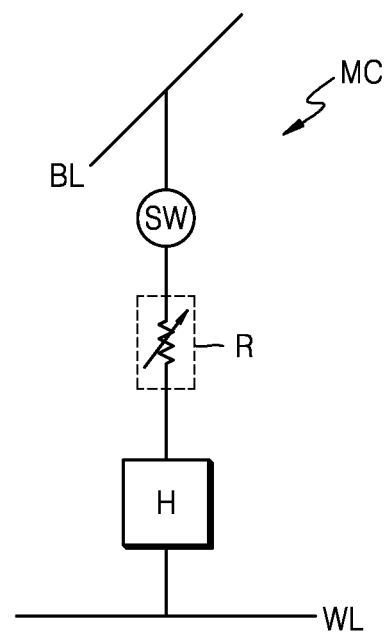
FIGS. 26A, 26B and 26C respectively illustrate examples of possible implementation variations for the resistive memory cells MC of FIG. 25 according to embodiments of the inventive concept.
Figure 26B:
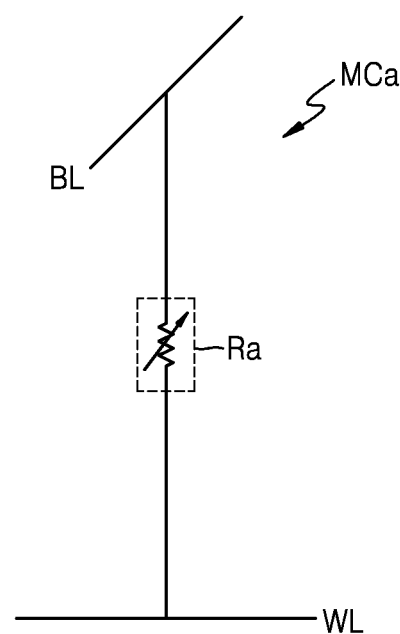
Figure 26C:
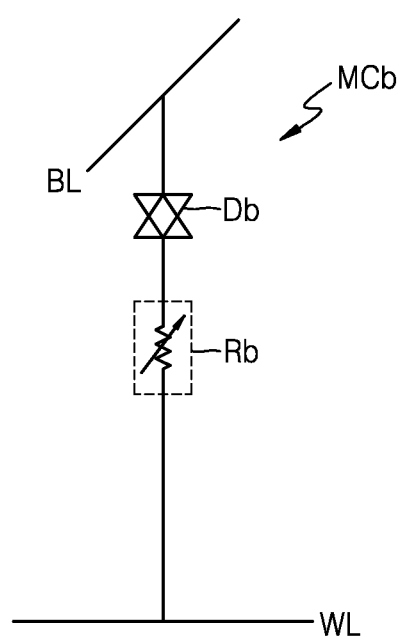

FIGS. 26A, 26B and 26C respectively illustrate examples of possible implementation variations for the resistive memory cells MC of FIG. 25 according to embodiments of the inventive concept.

Referring to FIG. 26A, a memory cell MC may include a variable resistance element R, a select element SW, and a heating element H. The variable resistance element R may be referred to as a variable resistor or a variable resistance material, and the select element SW may be referred to as a switching element. In addition, the heating element H may be referred to as a heating electrode or a heating electrode layer.

In one embodiment, the variable resistance element R may be connected between the select element SW and the heating element H. The select element SW may be connected to the bit line BL. The heating element H may be connected to the word line WL. In other words, one end of the select element SW may be connected to the bit line BL, and the other end of the select element SW may be connected to the variable resistance element R. In addition, one end of the heating element H may be connected to the word line WL, and the other end of the heating element H may be connected to the variable resistance element R.

The variable resistance element R may be changed to one of a plurality of resistance states by an applied electric pulse (e.g., a program current). The variable resistance element R may include a phase-change material, a crystal state of which is changed according to an amount of current. The phase-change material may use various types of materials, for example, GaSb, InSb, InSe, Sb2Te3, and GeTe, in which two elements are combined, GeSbTe(GST), GaSeTe, InSbTe, SnSb2Te4, and InSbGe, in which three elements are combined, and AgInSbTe, (GeSn)SbTe, GeSb(SeTe), and Te81Ge15Sb2S2, in which four elements are combined.

The phase-change material may have an amorphous state having a relatively high resistance and a crystal state having a relatively low resistance. The phase of the phase-change material may be changed by Joule's heat generated according to the amount of current. Data may be written and stored in relation to differing material phases. For example, data may be stored in the variable resistance element R by defining a high resistance state or a reset state as "0" and a low resistance state or a set state as "1".

In other embodiments, the variable resistance element R may include perovskite compounds, transition metal oxides, magnetic materials, ferromagnetic materials, or antiferromagnetic materials, instead of the phase-change material.

The select element SW may control the current supply to the variable resistance element R according to the voltage or current applied to the connected word line WL. The select element SW may be an ovonic threshold switch (OTS) including a chalcogenide compound. The ovonic threshold switch may include a material including arsenic (AS), germanium (Ge), selenium (Se), tellurium (Te), silicon (Si), bismuth (Bi), sulphur (S), and stibium (Sb). In particular, the ovonic threshold switch may include a six-element material in which selenium (Se) and sulphur (S) are added to a composite including germanium (Ge), silicon (Si), arsenic (As), and tellurium (Te).

The heating element H may heat the variable resistance element R during the data program (or write) operation (e.g., an operation defining reset or set states). The heating element H may include a conductive material capable of generating sufficient heat to phase-change the variable resistance element without reacting with the variable resistance element R. For example, the heating element H may include a carbon-based conductive material.

In example embodiments, the heating element H may include a high melting point metal or a nitride thereof, such as TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), silicon carbide (SiC), silicon carbon nitride (SiCN), carbon nitride (CN), titanium carbon nitride (TiCN), and tantalum carbon nitride (TaCN).

Referring to FIG. 26B, a memory cell MCa may include a variable resistance element Ra, and the variable resistance element Ra may be connected between a bit line BL and a word line WL. The memory cell MCa may store data by a program current applied through the bit line BL. In addition, data stored in the memory cell MCa may be read by a read current applied through the word line WL.

Referring to FIG. 26C, a memory cell MCb may include a variable resistance element Rb and a bidirectional diode Db. The variable resistance element Rb may include a resistance material for storing data. The bidirectional diode Db may be connected between the variable resistance element Rb and a bit line BL, and the variable resistance element Rb may be connected to a word line WL and the bidirectional diode Db. The bidirectional diode Db may block a leakage current flowing through a non-selected resistive memory cell.

Figure 27A:
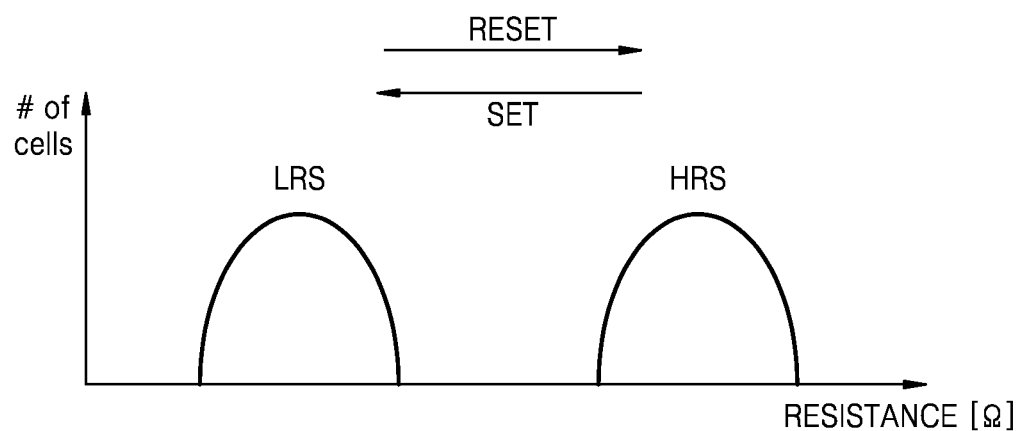
FIG. 27A is a graph illustrating a distribution of single-level (SLC), resistive memory cells MC that may be used in the example of FIG. 25.

FIG. 27A is a graph illustrating a distribution of single-level (SLC), resistive memory cells MC that may be used in the example of FIG. 25.

Referring to FIG. 27A, the horizontal axis indicates memory cell resistance and the vertical axis indicates a number of resistive memory cells MC. For example, when the memory cell MC is a single-level, resistive memory cell, it may be programmed to a low resistance state LRS (a SET state) or a high resistance state HRS (a RESET state), where the low resistance state LRS and the high resistance state HRS may respectively correspond to assigned data states of "0" and "1", for example.

An operation that switches the memory cell MC from the high resistance state HRS to the low resistance state LRS by applying an appropriate program current to the resistive memory cell MC may be referred to as a set operation or a set write operation. An operation that switches the memory cell MC from the low resistance state LRS to the high resistance state HRS by applying an appropriate program current to the memory cell MC may be referred to as a reset operation or a reset write operation.

Figure 27B:
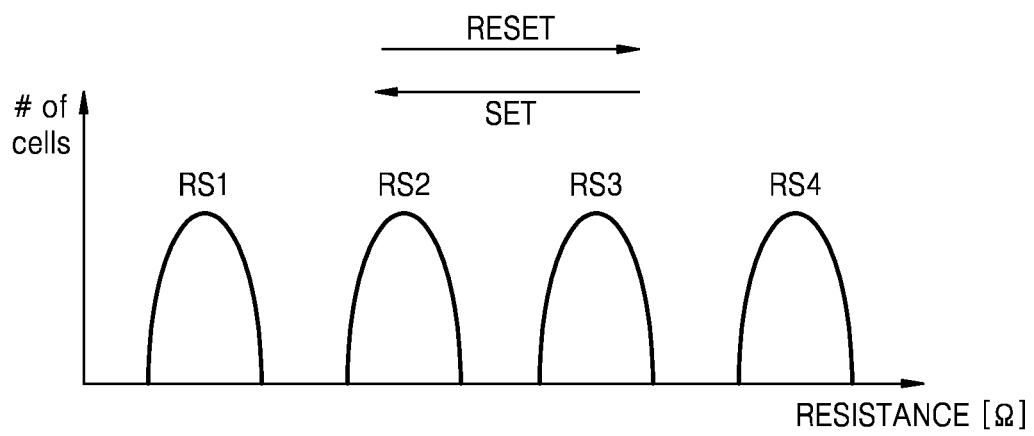
FIG. 27B is a graph illustrating a distribution of multi-level (MLC) resistive memory cells MC that may be used in the example of FIG. 25.

FIG. 27B is a graph illustrating a distribution of multi-level (MLC) resistive memory cells MC that may be used in the example of FIG. 25.

Referring to FIG. 27B, the multi-level, resistive memory cell MC may be used to program 2 data bits according to one of a first resistance state RS1, a second resistance state RS2, a third resistance state RS3, and a fourth resistance state RS4. However, embodiments of the inventive concept are not limited thereto. In one or more embodiments, a plurality of memory cells may include triple level cells (TLSs) each capable of storing 3-bit data and may have one of eight resistance states accordingly. In one or more embodiments, a plurality of memory cells may include memory cells each capable of storing 4-bit or more data.

Each of the resistance states RS1, RS2, RS3, and RS4 may correspond to one of data "00", data "01", data "10", and data "11". In one embodiment, a resistance level (R) may increase in the order of data "11", data "01", data "00", and data "10". That is, the first resistance state RS1 may correspond to data "11", the second resistance state RS2 may correspond to data "01", the third resistance state RS3 may correspond to data "00", and the fourth resistance state RS4 may correspond to data "10".

Figure 28:
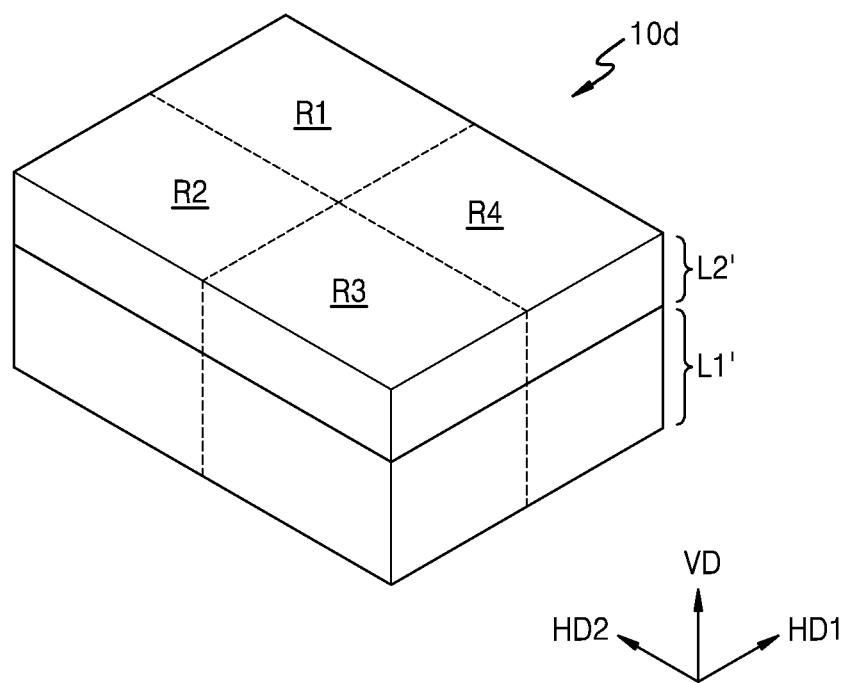
FIG. 28 is a perspective view of a memory device according to an embodiment of the inventive concept.
Figure 29:
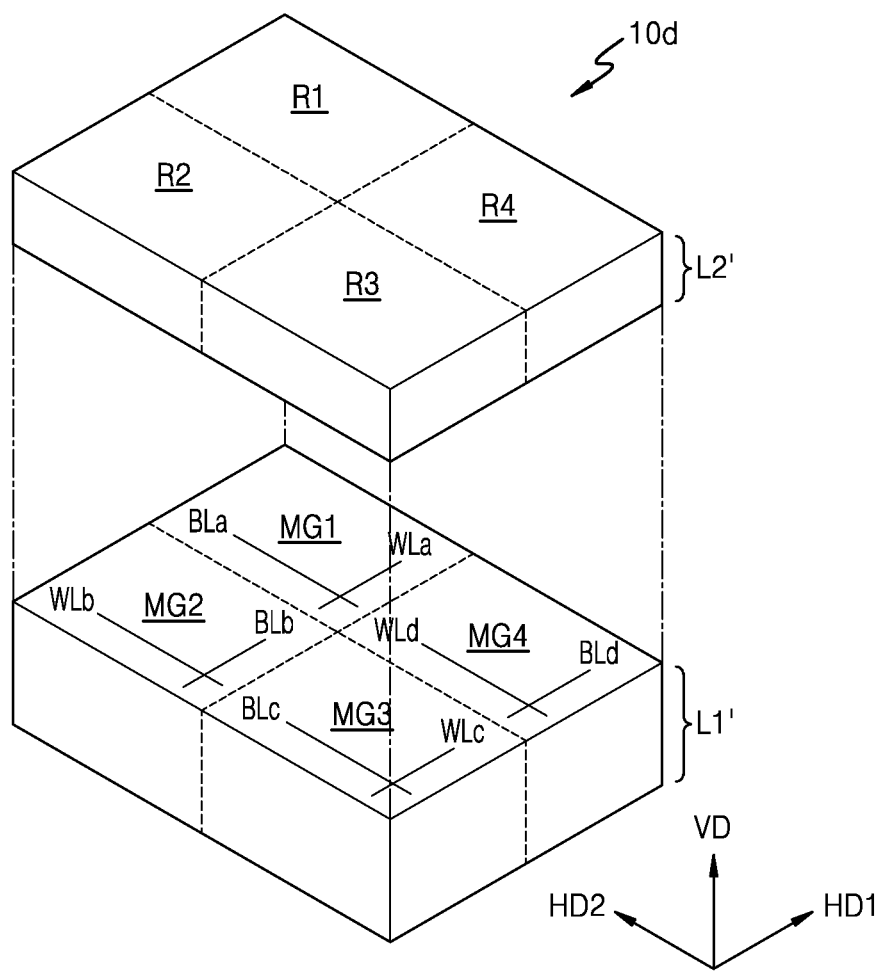
FIG. 29 is a perspective view of a memory device including a second semiconductor layer that is stacked on top of a first semiconductor layer including four memory groups according to embodiments of the inventive concept.

FIG. 28 is a perspective view of a memory device 10d according to an embodiment of the inventive concept. FIG. 29 is a perspective view of a memory device including a second semiconductor layer that is stacked on top of a first semiconductor layer including four memory groups according to embodiments of the inventive concept.

Referring to FIGS. 28 and 29, the memory device 10d may include a first semiconductor layer L1' and a second semiconductor layer L2', where the second semiconductor layer L2' is stacked on the first semiconductor layer L1' in the vertical direction VD. Given this assumed orientation for the "vertical" direction, the first semiconductor layer L1' and the second semiconductor layer L2' may be understood as extending in respective "horizontal" directions (i.e., in a first horizontal direction HD1 and a second horizontal direction HD2).

According to some embodiments, the memory cell array 100 of FIG. 1 may be disposed in the first semiconductor layer L1', and the peripheral circuitry 200 of FIG. 1 may be disposed in the second semiconductor layer L2'. Such embodiments may be understood as having a "Peripheral-Over-Cell" (POC) structure. In this regard, the first semiconductor layer L1' may includes substrate(s) and the memory cell array 100, and the second semiconductor layer L2' may include substrate(s) and various circuits among the peripheral circuitry 200 that are formed in the second semiconductor layer L2' by the combination of semiconductor devices such as transistors and wiring patterns. After the memory cell array 100, including electrical devices and corresponding wiring (e.g., word lines WL and bit lines BL), is formed in the first semiconductor layer L1' and various circuits and wiring are formed in the second semiconductor layer L2', the first semiconductor layer L1' and the second semiconductor layer L2' may be bonded together.

As shown in FIG. 29, first to fourth memory groups MG1 to MG4 may be arranged in the first semiconductor layer L1', where the first and second memory groups MG1 and MG2 are adjacent in the first horizontal direction HD1, the third and fourth memory groups MG3 and MG4 are adjacent in the first horizontal direction HD1, the first and fourth memory groups MG1 and MG4 are adjacent in the second horizontal direction HD2, and the second and third memory groups MG2 and MG3 are adjacent in the second horizontal direction HD2. This particular configuration may be termed a two-by-two memory group arrangement. Any one of the foregoing descriptions provided with reference to one or more of FIGS. 7-17 may be applied into this embodiment.

Figure 30:
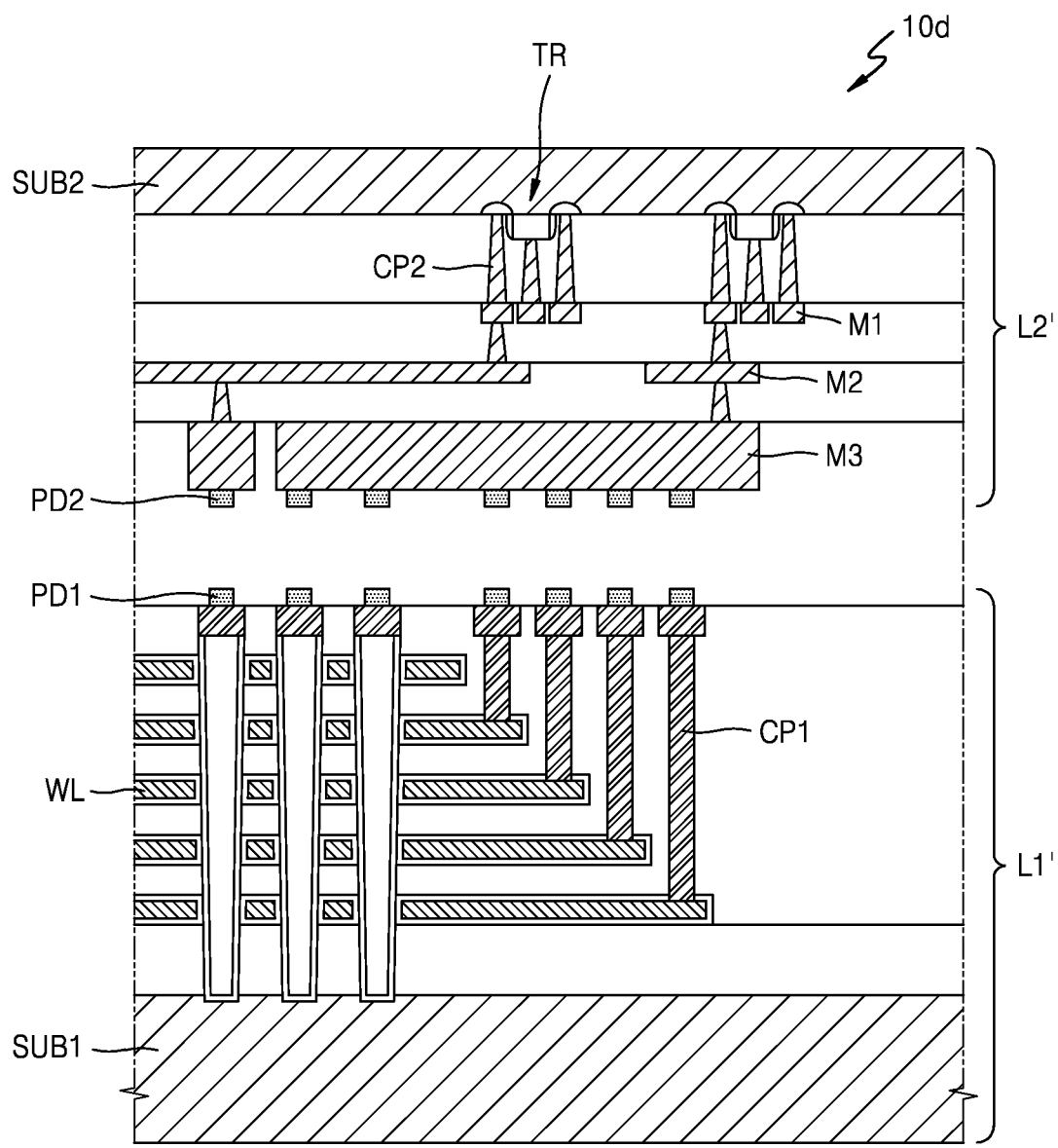
FIG. 30 is a cross-sectional view illustrating the memory device of FIG. 29 according to some example embodiments.

FIG. 30 is a cross-sectional view illustrating the memory device 10d of FIG. 29 according to some example embodiments.

Referring to FIG. 30, the first semiconductor layer L1' may include a first substrate SUB1 and the second semiconductor layer L2' may include a second substrate SUB2. The memory cell array 110 of FIG. 1 may be disposed on the first semiconductor layer L1'. A plurality of word lines WL may be stacked over the first substrate SUB1 and may be connected to corresponding pads PD1 through corresponding contact plugs CP1. The peripheral circuitry 200 of FIG. 1 may be disposed on the second semiconductor layer L2'. Each of the first and second substrates SUB1 and SUB2 may be a semiconductor substrate including a semiconductor material such as crystalline silicon or crystalline germanium and may be manufactured from a silicon wafer.

A plurality of semiconductor devices (for example, transistors TR) may be provided on the second substrate SUB2 included in the second semiconductor layer L2' and may be electrically connected to contact pads PD2 through corresponding contact plug CP2, metal lines M1, M2 and M3. For example, the semiconductor devices provided on the second semiconductor layer L2' may configure a circuit corresponding to the first to fourth row decoders 311 to 314, and the first to fourth page buffers 321 to 324.

Figure 31:
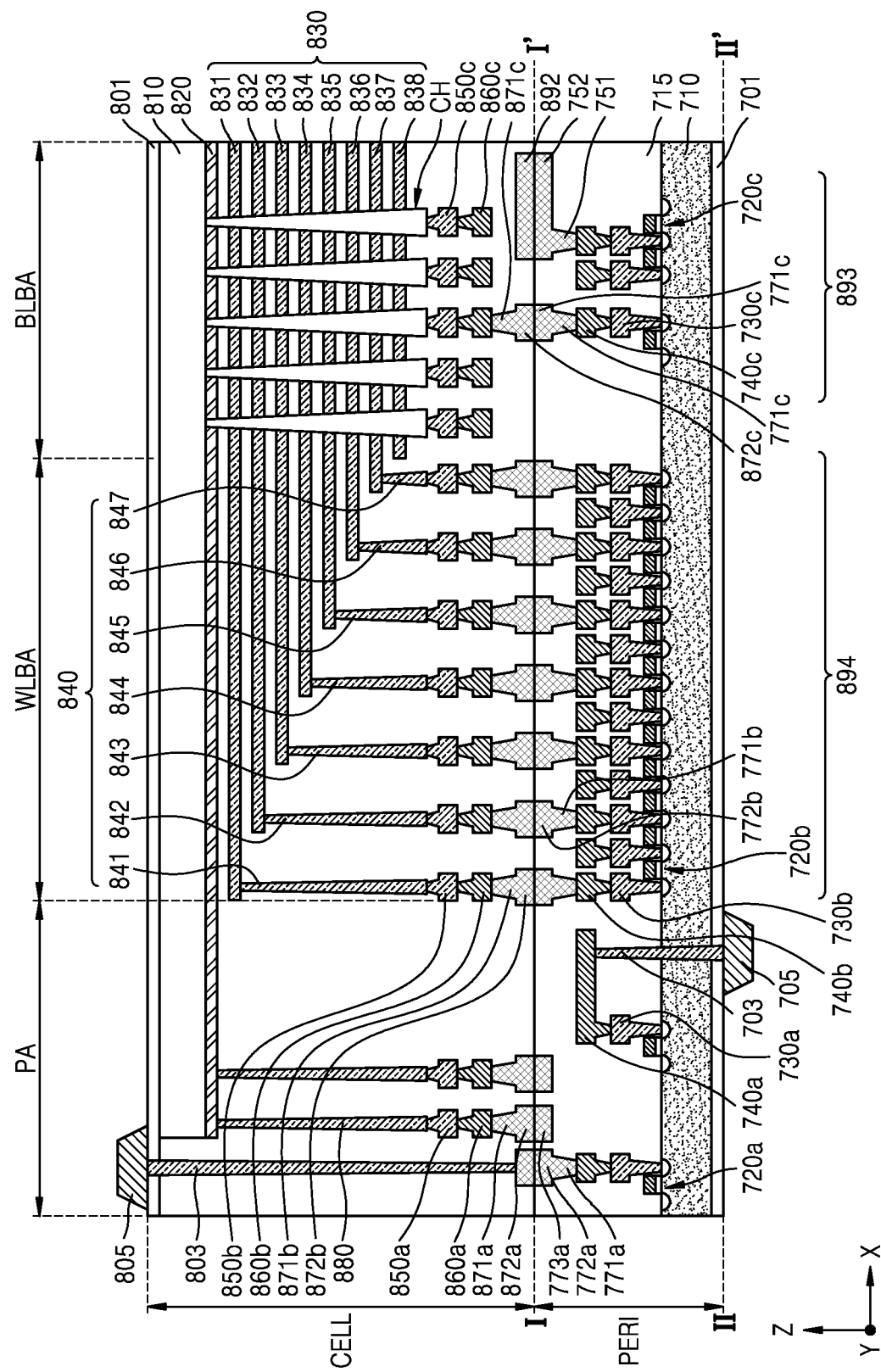
FIG. 31 illustrates a memory device having a chip-to-chip structure, according to embodiments of the inventive concept.

FIG. 31 illustrates a memory device 900 having a chip-to-chip structure, according to embodiments of the inventive concept.

Referring to FIG. 31, a memory device 900 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten. Each memory device of the above embodiments may be implemented as the memory device 900.

Each of the peripheral circuit region PERI and the cell region CELL of the memory device 900 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In an example embodiment, the first metal layers 730a, 730b, and 730c may be formed of tungsten having relatively high resistance, and the second metal layers 740a, 740b, and 740c may be formed of copper having relatively low resistance.

In an example embodiment illustrate in FIG. 31, although the first metal layers 730a, 730b, and 730c and the second metal layers 740a, 740b, and 740c are shown and described, they are not limited thereto, and one or more metal layers may be further formed on the second metal layers 740a, 740b, and 740c. At least a portion of the one or more metal layers formed on the second metal layers 740a, 740b, and 740c may be formed of aluminum or the like having a lower resistance than those of copper forming the second metal layers 740a, 740b, and 740c.

The interlayer insulating layer 715 may be disposed on the first substrate 710 and cover the plurality of circuit elements 720a, 720b, and 720c, the first metal layers 730a, 730b, and 730c, and the second metal layers 740a, 740b, and 740c. The interlayer insulating layer 715 may include an insulating material such as silicon oxide, silicon nitride, or the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically connected to c in a bonding manner, and the lower bonding metals 771b and 772b and the upper bonding metals 871b and 872b may be formed of aluminum, copper, tungsten, or the like. Further, the upper bonding metals 871b and 872b in the cell region CELL may be referred as first metal pads and the lower bonding metals 771b and 772b in the peripheral circuit region PERI may be referred as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (a Z-axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction, perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In an example embodiment, the bit line 860c may extend in a first direction (a Y-axis direction), parallel to the upper surface of the second substrate 810.

In an example embodiment illustrated in FIG. 31, an area in which the channel structure CH, the bit line 860c, and the like are disposed may be defined as the bit line bonding area BLBA. In the bit line bonding area BLBA, the bit line 860c may be electrically connected to the circuit elements 720c providing a page buffer 893 in the peripheral circuit region PERI. For example, the bit line 860c may be connected to upper bonding metals 871c and 872c in the cell region CELL, and the upper bonding metals 871c and 872c may be connected to lower bonding metals 771c and 772c connected to the circuit elements 720c of the page buffer 893.

In the word line bonding area WLBA, the plurality of word lines 830 may extend in a second direction (an X-axis direction), parallel to the upper surface of the second substrate 810, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second direction. A first metal layer 850b and a second metal layer 860b may be connected to an upper portion of the plurality of cell contact plugs 840 connected to the plurality of word lines 830, sequentially. The plurality of cell contact plugs 840 may be connected to the circuit region PERI by the upper bonding metals 871b and 872b of the cell region CELL and the lower bonding metals 771b and 772b of the peripheral circuit region PERI in the word line bonding area WLBA.

The plurality of cell contact plugs 840 may be electrically connected to the circuit elements 720b providing a row decoder 894 in the peripheral circuit region PERI. In an example embodiment, operating voltages of the circuit elements 720b providing the row decoder 894 may be different than operating voltages of the circuit elements 720c providing the page buffer 893. For example, operating voltages of the circuit elements 720c providing the page buffer 893 may be greater than operating voltages of the circuit elements 720b providing the row decoder 894.

A common source line contact plug 880 may be disposed in the external pad bonding area PA. The common source line contact plug 880 may be formed of a conductive material such as a metal, a metal compound, polysilicon, or the like, and may be electrically connected to the common source line 820. A first metal layer 850a and a second metal layer 860a may be stacked on an upper portion of the common source line contact plug 880, sequentially. For example, an area in which the common source line contact plug 880, the first metal layer 850a, and the second metal layer 860a are disposed may be defined as the external pad bonding area PA.

Input-output pads 705 and 805 may be disposed in the external pad bonding area PA. Referring to FIG. 31, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c disposed in the peripheral circuit region PERI through a first input-output contact plug 703, and may be separated from the first substrate 710 by the lower insulating film 701. In addition, a side insulating film may be disposed between the first input-output contact plug 703 and the first substrate 710 to electrically separate the first input-output contact plug 703 and the first substrate 710.

Referring to FIG. 31, an upper insulating film 801 covering the upper surface of the second substrate 810 may be formed on the second substrate 810, and a second input-output pad 805 may be disposed on the upper insulating layer 801. The second input-output pad 805 may be connected to at least one of the plurality of circuit elements 720a, 720b, and 720c disposed in the peripheral circuit region PERI through a second input-output contact plug 803.

According to embodiments, the second substrate 810 and the common source line 820 may not be disposed in an area in which the second input-output contact plug 803 is disposed. Also, the second input-output pad 805 may not overlap the word lines 830 in the third direction (the Z-axis direction). Referring to FIG. 31, the second input-output contact plug 803 may be separated from the second substrate 810 in a direction, parallel to the upper surface of the second substrate 810, and may pass through the interlayer insulating layer 815 of the cell region CELL to be connected to the second input-output pad 805.

According to embodiments, the first input-output pad 705 and the second input-output pad 805 may be selectively formed. For example, the memory device 900 may include only the first input-output pad 705 disposed on the first substrate 710 or the second input-output pad 805 disposed on the second substrate 810. Alternatively, the memory device 900 may include both the first input-output pad 705 and the second input-output pad 805.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 900 may include a lower metal pattern 773a, corresponding to an upper metal pattern 872a formed in an uppermost metal layer of the cell region CELL, and having the same shape as the upper metal pattern 872a of the cell region CELL, in an uppermost metal layer of the peripheral circuit region PERI. In the peripheral circuit region PERI, the lower metal pattern 773a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the cell region CELL by a Cu—Cu bonding.

Further, the bit line bonding area BLBA, an upper metal pattern 892, corresponding to a lower metal pattern 752 formed in the uppermost metal layer of the peripheral circuit region PERI, and having the same shape as the lower metal pattern 752 of the peripheral circuit region PERI, may be formed in an uppermost metal layer of the cell region CELL.

A contact may not be formed on the upper metal pattern 892 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

While the inventive concept has been particularly shown and described with reference to embodiments thereof, it will be understood that various changes in form and details may be made therein without departing from the spirit and scope of the following claims.

What is claimed is:

1. A non-volatile memory, comprising:
a memory cell region including a first memory group, a second memory group, a third memory group, a fourth memory group, and a first metal pad; and
a peripheral circuit region including a second metal pad and vertically connected to the memory cell region by the first metal pad and the second metal pad,
wherein the peripheral circuit region further includes a first region, a second region, a third region and a fourth region respectively underlying the first memory group, second memory group, third memory group and fourth memory group, and
the first region includes one driving circuit connected to memory cells of one of the second memory group, third memory group and fourth memory group through a first word line, and another driving circuit connected to memory cells of the first memory group through a first bit line, wherein the first word line and first bit line extend in the same horizontal direction.

2. The non-volatile memory of claim 1, wherein each of the first memory group and third memory group includes word lines extending in a first horizontal direction and bit lines extending in a second horizontal direction, and
each of the second memory group and fourth memory group includes word lines extending in the second horizontal direction and bit lines extending in the first horizontal direction.

3. The non-volatile memory of claim 2, wherein the one driving circuit is a first row decoder connected to the first word line of the one of the second memory group, third memory group and fourth memory group, and the another driving circuit is a first page buffer connected to the first bit line of the first memory group.

4. The non-volatile memory of claim 3, wherein the first row decoder is disposed in the first region between the first page buffer and one of the second region, third region and fourth region underlying the one of the second memory group, third memory group and fourth memory group.

5. The non-volatile memory of claim 4, wherein the first row decoder extends along an entire length of a boundary between the first region and the one of the second region, third region and fourth region, and the first page buffer occupies more than half of the first region.

6. The non-volatile memory of claim 3, wherein the first memory group and second memory group are adjacent in the first horizontal direction, the third memory group and fourth memory group are adjacent in the first horizontal direction, the first memory group and fourth memory group are adjacent in the second horizontal direction, and the second memory group and third memory group are adjacent in the second horizontal direction.

7. The non-volatile memory of claim 6, wherein the first row decoder is connected to word lines of the fourth memory group including the first word line and the first page buffer is connected to bit lines of the first memory group including the first bit line,
the second region includes a second row decoder connected to word lines of the first memory group and a second page buffer connected to bit lines of the second memory group,
the third region includes a third row decoder connected to word lines of the second memory group and a third page buffer connected to bit lines of the third memory group, and
the fourth region includes a fourth row decoder connected to word lines of the third memory group and a fourth page buffer connected to bit lines of the fourth memory group.

8. The non-volatile memory of claim 7, wherein the first row decoder is disposed in the first region between the first page buffer and the fourth region, the second row decoder is disposed in the second region between the second page buffer and the first region, the third row decoder is disposed in the third region between the third page buffer and the second region, and the fourth row decoder is disposed in the fourth region between the fourth page buffer and the third region.

9. The non-volatile memory of claim 8, wherein the first row decoder extends along an entire length of a boundary between the first region and the fourth region and the first page buffer occupies more than half of the first region,
the second row decoder extends along an entire length of a boundary between the second region and the first region and the second page buffer occupies more than half of the second region,
the third row decoder extends along an entire length of a boundary between the third region and the second region and the third page buffer occupies more than half of the third region, and
the fourth row decoder extends along an entire length of a boundary between the fourth region and the third region and the fourth page buffer occupies more than half of the fourth region.

10. The non-volatile memory of claim 2, wherein word lines of the first memory group, second memory group, third memory group and fourth memory group are respectively isolated from one another, and bit lines of the first memory group, second memory group, third memory group and fourth memory group are respectively isolated from one another.

11. The non-volatile memory of claim 1, wherein the first memory group and second memory group are adjacent in a first horizontal direction, the third memory group and fourth memory group are adjacent in the first horizontal direction, the first memory group and fourth memory group are adjacent in a second horizontal direction, and the second memory group and third memory group are adjacent in the second horizontal direction,
the first memory group includes first word lines extending in the first horizontal direction and first bit lines extending in the second horizontal direction,
the second memory group includes second word lines extending in the second horizontal direction and second bits lines extending in the first horizontal direction, the third memory group includes third word lines extending in the first horizontal direction and third bits lines extending in the second horizontal direction, and the fourth memory group includes fourth word lines extending in the first horizontal direction and fourth bits lines extending in the second horizontal direction.

12. The non-volatile memory of claim 3, wherein the first region, second region, third region and fourth region are arranged substantially in a rectangle, and the first row decoder comprises:
  a first portion centrally disposed in the rectangle and connected to at least one word line of the first memory group, and
  a second portion extending from the first portion of the first row decoder to an outer edge of the rectangle and connected to the word lines of at least one of the second memory group, third memory group and fourth memory group.

13. The non-volatile memory of claim 12, wherein the second portion of the first row decoder is connected to word lines of the fourth memory group.

14. The non-volatile memory of claim 13, wherein
the second region comprises;
  a second row decoder including a first portion centrally disposed in the rectangle and connected to at least one word line of the second memory group, and a second portion extending from the first portion of the second row decoder to an outer edge of the rectangle and connected to the word lines of the first memory group, and a second page buffer connected to word lines of the second memory group;
the third region comprises;
  a third row decoder including a first portion centrally disposed in the rectangle and connected to at least one word line of the third memory group, and a second portion extending from the first portion of the third row decoder to an outer edge of the rectangle and connected to the word lines of the second memory group, and a third page buffer connected to word lines of the third memory group; and
the fourth region comprises;
  a fourth row decoder including a first portion centrally disposed in the rectangle and connected to at least one word line of the fourth memory group, and a second portion extending from the first portion of the fourth row decoder to an outer edge of the rectangle and connected to the word lines of the third memory group, and a fourth page buffer connected to word lines of the fourth memory group.

15. The non-volatile memory of claim 2, wherein the one driving circuit is a first page buffer connected to bits lines of the one of the second memory group, third memory group and fourth memory group, and the another driving circuit is a first row decoder connected to word lines of the first memory group.

16. The non-volatile memory of claim 1, wherein the first metal pad and the second metal pad formed of copper.

17. The non-volatile memory of claim 1, wherein the first metal pad and the second metal pad are connected by bonding manner.

18. The non-volatile memory of claim 1, wherein the memory cell region is formed on a first wafer and the peripheral circuit region is formed on a second wafer.

19. A non-volatile memory, comprising:
  a memory cell region including a first memory group, a second memory group, a third memory group, a fourth memory group, and a first metal pad; and
  a peripheral circuit region including a second metal pad and vertically connected to the memory cell region by the first metal pad and the second metal pad,
  wherein the peripheral circuit region further includes a first region, a second region, a third region and a fourth region respectively underlying the first memory group, second memory group, third memory group and fourth memory group, and
  the first region includes one driving circuit connected to the first memory group, and another driving circuit connected to both the first memory group and one of the second memory group, third memory group and fourth memory group,
  wherein each of the first memory group and the third memory group includes word lines extending in a first horizontal direction and bit lines extending in a second horizontal direction, and each of the second memory group and the fourth memory group includes word lines extending in the second horizontal direction and bit lines extending in the first horizontal direction.

20. A non-volatile memory, comprising:
  a memory cell region including a first memory group, a second memory group, and a first metal pad; and
  a peripheral circuit region including a second metal pad and vertically connected to the memory cell region by the first metal pad and the second metal pad,
  wherein the peripheral circuit region further includes a first region underlying the first memory group, a second region underlying the second memory group, and a peripheral region,
  the first memory group includes word lines extending in a first horizontal direction and bit lines extending in a second horizontal direction, and the second memory group includes word lines extending in the second horizontal direction and bit lines extending in the first horizontal direction,
  the first region includes a first driving circuit connected to the first memory group, the second region includes a second driving circuit connected to the second memory group and a third driving circuit connected to the first memory group, and
  the peripheral region includes a fourth driving circuit connected to the second memory group.

* * * * *